(12) United States Patent
Hu et al.

(10) Patent No.: US 11,961,697 B2
(45) Date of Patent: Apr. 16, 2024

(54) APPARATUS USING CHARGED PARTICLE BEAMS

(71) Applicant: ASML Netherlands B.V., Veldhoven (NL)

(72) Inventors: Xuerang Hu, San Jose, CA (US);
Xuedong Liu, San Jose, CA (US);
Weiming Ren, San Jose, CA (US);
Zhong-Wei Chen, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 18/144,131

(22) Filed: May 5, 2023

(65) Prior Publication Data
US 2023/0411110 A1 Dec. 21, 2023

Related U.S. Application Data

(63) Continuation of application No. 16/753,285, filed as application No. PCT/EP2018/076707 on Oct. 2, 2018, now Pat. No. 11,670,477.
(Continued)

(51) Int. Cl.
*H01J 37/09* (2006.01)
*H01J 37/12* (2006.01)
(Continued)

(52) U.S. Cl.
CPC .............. *H01J 37/09* (2013.01); *H01J 37/12* (2013.01); *H01J 37/1472* (2013.01);
(Continued)

(58) Field of Classification Search
CPC ........ H01J 37/09; H01J 37/12; H01J 37/1472; H01J 37/153; H01J 37/28;
(Continued)

(56) References Cited

U.S. PATENT DOCUMENTS 6,335,127 B1 * 1/2002 Ono .......................... G03F 1/20
430/296
6,566,664 B2    5/2003 Muraki
(Continued)

FOREIGN PATENT DOCUMENTS

CN    102067271 A    5/2011
CN    103650097 A    3/2014
(Continued)

OTHER PUBLICATIONS

International Search Report and Written Opinion issued in related PCT International Application No. PCT/EP2018/076707, dated Feb. 25, 2019 (16 pgs.).
(Continued)

*Primary Examiner* — Sean M Luck
(74) *Attorney, Agent, or Firm* — Finnegan, Henderson, Farabow, Garrett & Dunner, LLP

(57) ABSTRACT

A multi-beam apparatus for multi-beam inspection with an improved source conversion unit providing more beamlets with high electric safety, mechanical availability and mechanical stabilization has been disclosed. The source-conversion unit comprises an image-forming element array having a plurality of image-forming elements, an aberration compensator array having a plurality of micro-compensators, and a pre-bending element array with a plurality of pre-bending micro-deflectors. In each of the arrays, adjacent elements are placed in different layers, and one element may comprise two or more sub-elements placed in different layers. The sub-elements of a micro-compensator may have different functions such as micro-lens and micro-stigmators.

20 Claims, 11 Drawing Sheets

Related U.S. Application Data

(60) Provisional application No. 62/567,134, filed on Oct. 2, 2017.

(51) Int. Cl.
 H01J 37/14 (2006.01)
 H01J 37/147 (2006.01)
 H01J 37/15 (2006.01)
 H01J 37/153 (2006.01)
 H01J 37/28 (2006.01)

(52) U.S. Cl.
 CPC ............ *H01J 37/153* (2013.01); *H01J 37/28* (2013.01); *H01J 2237/0453* (2013.01); *H01J 2237/1205* (2013.01); *H01J 2237/1534* (2013.01); *H01J 2237/24592* (2013.01); *H01J 2237/2817* (2013.01)

(58) Field of Classification Search
 CPC ....... H01J 2237/0453; H01J 2237/1205; H01J 2237/1534; H01J 2237/24592; H01J 2237/2817
 See application file for complete search history.

(56) References Cited

U.S. PATENT DOCUMENTS

| | | | |
|---|---|---|---|
| 6,617,595 B1 | 9/2003 | Okunuki | |
| 6,903,353 B2* | 6/2005 | Muraki | H01J 37/045 250/492.22 |
| 7,060,984 B2 | 6/2006 | Nagae | |
| 7,173,262 B2* | 2/2007 | Hosoda | H01J 37/3174 250/492.23 |
| 8,368,015 B2 | 2/2013 | Platzgummer | |
| 9,607,805 B2 | 3/2017 | Liu | |
| 2003/0209673 A1 | 11/2003 | Ono | |
| 2004/0061064 A1 | 4/2004 | Ono | |
| 2005/0087701 A1 | 4/2005 | Lammer-Pachlinger | |
| 2005/0199822 A1 | 9/2005 | Saini | |
| 2005/0201246 A1 | 9/2005 | Buschbeck | |
| 2006/0131698 A1 | 6/2006 | Jeong | |
| 2008/0023643 A1 | 1/2008 | Kruit et al. | |
| 2008/0237460 A1 | 10/2008 | Fragner | |
| 2010/0178602 A1 | 7/2010 | Seto | |
| 2011/0260040 A1 | 10/2011 | Wieland | |
| 2015/0021493 A1 | 1/2015 | Platzgummer | |
| 2015/0255249 A1 | 9/2015 | Ogasawara | |
| 2015/0311030 A1 | 10/2015 | Platzgummer | |
| 2015/0340195 A1 | 11/2015 | Brodie | |
| 2016/0049278 A1 | 2/2016 | Wang | |
| 2016/0111246 A1 | 4/2016 | Matsumoto | |
| 2016/0268096 A1 | 9/2016 | Ren | |
| 2016/0284505 A1 | 9/2016 | Ren | |
| 2017/0025241 A1 | 1/2017 | Li | |
| 2017/0025243 A1 | 1/2017 | Ren et al. | |
| 2017/0213688 A1 | 7/2017 | Ren et al. | |
| 2017/0345612 A1 | 11/2017 | Touya | |
| 2020/0051779 A1 | 2/2020 | Ren | |
| 2020/0211811 A1 | 7/2020 | Ren | |

FOREIGN PATENT DOCUMENTS

| | | |
|---|---|---|
| JP | 2002-319532 | 10/2002 |
| JP | 2009-545118 | 12/2009 |
| JP | 2011-517130 | 5/2011 |
| JP | 2014-507051 | 3/2014 |
| JP | 2014-519724 | 8/2014 |
| KR | 10-2011-0007199 A | 1/2011 |
| KR | 10-2014-0048144 A | 4/2014 |
| KR | 10-2460680 B1 | 10/2022 |
| TW | 201515044 A | 4/2015 |
| WO | WO 2006/126872 A1 | 11/2006 |
| WO | WO 2009/127658 A1 | 10/2009 |
| WO | WO 2016/145458 | 9/2016 |
| WO | WO 2017/015483 A | 1/2017 |

OTHER PUBLICATIONS

Notification of Reason(s) for Refusal issued in related Korean Patent Application No. 10-2020-7009448; dated Nov. 23, 2021 (10 pgs.).

Notice of Reasons for Rejection issued by the Japanese Patent Office in related Japanese Patent Application No. 2020-516808, dated Jun. 2, 2021 (8 pgs.).

Notice of Reasons for Rejection issued in related Japanese Patent Application No. 2020-516808; dated Apr. 20, 2022 (14 pgs.).

First Office Action issued by the China Patent Office in related Chinese Patent Application No. 018800644147; dated Oct. 10, 2022 (15 pgs.).

Notification of Reason(s) for Refusal issued by the Korean Patent Office in related Korean Patent Application No. 10-2022-7037308; dated Jun. 22, 2023 (12 pgs.).

Notice of Deficiencies issued by the Israel Patent Office in related Israeli Patent Application No. 273564; mailed Jun. 28, 2023 (3 pgs.).

* cited by examiner

APPARATUS USING CHARGED PARTICLE BEAMS

CROSS-REFERENCE TO RELATED APPLICATIONS

This application is a continuation of U.S. application Ser. No. 16/753,285, filed Apr. 2, 2020, which claims priority to national stage filing under 35 U.S.C. § 371 of International Application No. PCT/EP2018/076707, filed on Oct. 2, 2018, and published as WO 2019/068666 A1, which claims priority of U.S. application 62/567,134 which was filed on Oct. 2, 2017. The contents of these applications are incorporated herein by reference in their entireties.

TECHNICAL FIELD

The embodiments provided herein disclose a multi-beam apparatus including an improved source conversion unit providing more beamlets.

BACKGROUND

In various steps of a semiconductor manufacturing process, pattern defects and/or uninvited particles can appear on a wafer and/or mask during the fabrication process, which can reduce the yield to a great degree. To meet the demand of resolution and reliability inspection brought by reducing the dimensions of semiconductor device, and to satisfy the demand of high throughput and high yield of the manufacturing process, multiple particle beams have been utilized in inspection systems to replace the previously employed Low-voltage Scanning Electron Microscope (LVSEM) utilizing a single primary electron beam to inspect one single area of the surface of a sample object at one time.

Multiple charged particle beams simultaneously form multiple beam spots on small scanned areas of a section of the surface of a sample at one time. This type of parallel scanning not only improves the efficiency of scanning, but also fundamentally reduces the charged particle interactions (Coulomb Effect) because the current of each beam of the plurality of charged particle beams is smaller when compared to a larger current needed for a single charged particle beam. These types of improvements can reduce the resolution deterioration of inspection due to the strong Coulomb Effect in a beam with a large current.

The multiple beams utilized in the inspection system may be either from multiple sources or from a single source. If the beams are from multiple sources, multiple columns may scan and focus the beams onto the surface, and the signals generated by the beams may be detected by detectors in the columns, respectively. An apparatus using beams from multiple sources may be referred to as a multi-column apparatus.

If charge particle beams are from a single source, a source conversion unit may be used to form multiple virtual or real images of the single beam source. The source conversion unit may have an electrically conductive layer with multiple apertures that divide the charged particles from the single source into multiple beams, which are also called beamlets. The source conversion unit may have micro-elements that can influence the beamlets to form multiple virtual or real images of the single source. An apparatus using beams from a single source may be referred to as a multi-beam apparatus.

There are different methods to form the multiple images of the single source. In some source conversion units, each micro-element functions as an electrostatic micro-lens that focuses one beamlet and forms one real image. In some source conversion units, each micro-element functions as an electrostatic micro-deflector, which deflects one beamlet and forms one virtual image.

A source conversion unit can include one beamlet-limiting mechanism, one aberration compensator array mechanism, and one image-forming mechanism. The beamlet-limiting mechanism includes a plurality of beam-limit apertures that divide the primary charged particle beam into a plurality of beamlets. The aberration compensator array mechanism includes, with respect to each beamlet, a micro-compensator element that compensates either field curvature aberration and/or astigmatism aberration. The image-forming mechanism includes a plurality of image-forming micro-elements, and each image-forming micro-element can be a round lens or a deflector. The plurality of image-forming micro-elements focuses or deflects the plurality of beamlets to form the plurality of parallel real or virtual images. In some instances where the primary charged particle beam is a non-parallel electron beam, the source conversion unit can further include a pre-bending element mechanism that includes a plurality of pre-bending micro-deflector elements that bend the plurality of beamlets to enter the beam-limiting mechanism in a perpendicular angle.

Moreover, the pitches of elements in one of these mechanisms are equal to pitches of corresponding elements of the other mechanisms. Accordingly, the pitches of beamlets therefore are the same as the pitches of the corresponding elements. To get more beamlets from the single source, the pitches of elements are preferably made as much as possible. Hence the mechanisms are made by MEMS technology. But these pitches cannot be reduced beyond a limitation determined by electrical safety, mechanical availability, and mechanical stabilization of the elements in the mechanism.

Existing structures of source conversion unit forebear the mechanical and electric constraints to further reduce the pitches of elements. One constraint is the mechanical availability of manufacturing process of elements on a surface. Another constraint is the mechanical stability of the structure of elements once it reaches the physical limit of the conductive materials used in manufacturing. Moreover, electric crosstalk between adjacent elements can bring electric safety concerns into the source conversion unit.

Therefore, a source conversion unit with smaller pitches of beamlets and meanwhile mechanical stability and electric safety overcoming mechanical and electric constraints is highly desirable in a multi-beam inspection system to further improve the inspection throughput of semiconductor manufacturing process.

SUMMARY

Embodiments of the present disclosure provide a multi-beam apparatus for multi-beam inspection with an improved source conversion unit providing more beamlets with high electric safety, mechanical availability and mechanical stabilization. In some embodiments, a source conversion unit is provided. The source-conversion unit comprises an image-forming element array having a plurality of image-forming elements and an aberration compensator array having a plurality of micro-compensators. The plurality of micro-compensators includes sub-micro-compensators being placed in multiple aberration-compensator layers. Some sub-micro-compensators are further configured to function as micro-lens, and some other sub-micro-compensators are further configured to function as micro-stigmators.

In some embodiments, a source conversion unit is provided. The source conversion unit comprises an image-forming element array having a plurality of image-forming elements. The plurality of image-forming elements is placed in two or more image-forming layers.

In some embodiments, a source conversion unit is provided. The source conversion unit comprises an image-forming element array having a plurality of image-forming elements and an aberration compensator array having a plurality of micro-compensators. The plurality of image-forming elements is placed in two or more image-forming layers. The plurality of micro-compensators is placed in two or more aberration-compensator layers. One of the plurality of micro-compensators may further include one micro-lens element and one micro-stigmator element placed in different aberration-compensator layers.

In some embodiments, a source-conversion unit is provided. The source-conversion unit comprises an image-forming element array having a plurality of image-forming elements, an aberration compensator array having a plurality of micro-compensators, and a pre-bending element array having a plurality of pre-bending micro-deflectors. The plurality of image-forming elements is placed in two or more image-forming layers. The plurality of micro-compensators is placed in two or more aberration-compensator layers. One of the plurality of micro-compensators may further includes one micro-lens element and one micro-stigmator element placed in different aberration-compensator layers. The pre-bending element array comprises two or more pre-bending layers and the pre-bending micro-deflectors are placed in the pre-bending layers corresponding to multiple beamlets.

In some embodiments, a source-conversion unit is provided. The source-conversion unit comprises an image-forming element array having two or more image-forming layers, an aberration-compensator element array having two or more aberration-compensator layers, and a pre-bending element array having two or more pre-bending layers. The source-conversion unit is further configured to comprise multiple shielding layers and insulating layers that together form electrostatic shield for each element in the image-forming element array, the aberration-compensator element array and the pre-bending element array.

In some embodiments, a multi-beam inspection system is provided. The multi-beam inspection system comprises source conversion unit in accordance with embodiments of the present disclosure.

DETAILED DESCRIPTION

Figure 1:
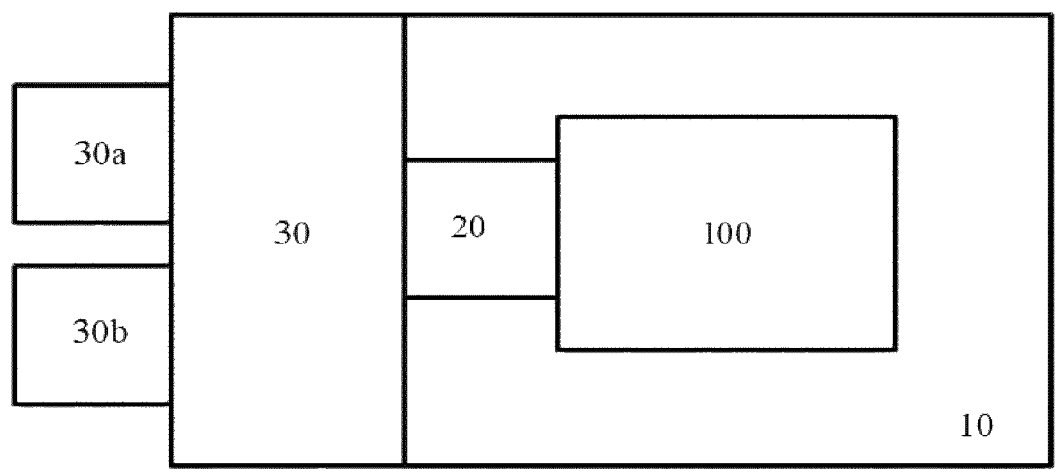
FIG. 1 is a schematic diagram illustrating an exemplary electron beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

The present invention relates to a Multi-beam Inspection (MBI) system utilizing multiple charge particle beams to simultaneously form images of multiple scanned areas of a section of the surface of a sample object under observation to inspect the quality of the surface with high resolution and high throughput in the manufacturing process of semiconductor.

The embodiments of the present disclosure provide charged particle beam inspection system providing a source-conversion unit for reducing pitches of beamlets, while keeping the pitches of elements in the image-forming element array, aberration compensator array, and/or pre-bending element array within ranges. The embodiments disclosed herein can improve electric safety, mechanical availability, and mechanical stabilization of the source-conversion unit.

The disclosed embodiments provide several features that can help with these improvements to electric safety, mechanical availability, and mechanical stabilization of the source-conversion unit. For example, in some embodiments, the source-conversion unit includes an image-forming element array having image-forming micro-deflectors that are placed in two or more layers, wherein adjacent image-forming micro-deflectors that deflect adjacent beamlets are not placed in the same layer. In some embodiments, the source conversion unit includes an aberration compensator array having micro-compensators that are placed in two or more layers, wherein adjacent micro-compensators that compensate aberrations of adjacent beamlets are not placed in the same layer. In some embodiments, the source-conversion unit includes an aberration compensator array having sub-micro-compensators (of micro-compensators) that are placed in four or more layers, wherein adjacent sub-micro-compensators that compensate aberrations of adjacent beamlets are not in the same layer. In other embodiments, the source-conversion unit includes a pre-bending element array having pre-bending micro-deflectors that are placed in two or more layers, wherein adjacent pre-bending micro-deflectors that deflect adjacent beamlets are not in the same layer. And in some embodiments, each of the layers has structure providing electrostatic shielding structure to shield each element and its beamlet path from adjacent elements and beamlet paths.

Moreover, the disclosed embodiments provide several features that improve electrical safety. For example, in some embodiments, the number of electrodes of sub-micro-compensators in each layer of the aberration compensator array is reduced, while in each layer, some of the sub-micro-compensators have annular structure to function as micro-lenses and the others have multi-pole structures to function as micro-stigmators. In some embodiments, micro-deflectors of an image-forming element array are divided into two or more sub-micro-deflectors and these sub-micro-deflectors are to be placed into two or more layers. In some embodiments, micro-deflectors of a pre-bending element array are divided into two or more sub-micro-deflectors and these sub-micro-deflectors are to be placed into two or more layers. In the image-forming element array or the pre-bending element array in these embodiments, each beamlet can be deflected in series by the sub-micro-deflectors of the corresponding micro-deflector. Therefore, the deflection voltage applied to each sub-micro-deflector that is required by the deflection purpose can be configured to be smaller than that of the corresponding micro-deflector. This improves electric safety of a source conversion unit.

As used herein, unless specifically stated otherwise, the term "or" encompasses all possible combinations, except where infeasible. For example, if it is stated that a database can include A or B, then, unless specifically stated otherwise or infeasible, the database can include A, or B, or A and B. As a second example, if it is stated that a database can include A, B, or C, then, unless specifically stated otherwise or infeasible, the database can include A, or B, or C, or A and B, or A and C, or B and C, or A and B and C.

Reference is now made to FIG. 1, which illustrates an exemplary electron beam inspection (EBI) system 100 consistent with embodiments of the present disclosure. As shown in FIG. 1, charged particle beam inspection system 1 includes a main chamber 10, a load/lock chamber 20, an electron beam tool 100, and an equipment front end module (EFEM) 30. Electron beam tool 100 is located within main chamber 10.

EFEM 30 includes a first loading port 30a and a second loading port 30b. EFEM 30 may include additional loading port(s). First loading port 30a and second loading port 30b receive wafer front opening unified pods (FOUPs) that contain wafers (e.g., semiconductor wafers or wafers made of other material(s)) or samples to be inspected (wafers and samples are collectively referred to as "wafers" hereafter). One or more robot arms (not shown) in EFEM 30 transport the wafers to load/lock chamber 20.

Load/lock chamber 20 is connected to a load/lock vacuum pump system (not shown), which removes gas molecules in load/lock chamber 20 to reach a first pressure below the atmospheric pressure. After reaching the first pressure, one or more robot arms (not shown) transport the wafer from load/lock chamber 20 to main chamber 100. Main chamber 100 is connected to a main chamber vacuum pump system (not shown), which removes gas molecules in main chamber 100 to reach a second pressure below the first pressure. After reaching the second pressure, the wafer is subject to inspection by electron beam tool 100. While the present disclosure provides examples of main chamber 100 housing an electron beam inspection system, it should be noted that aspects of the disclosure in their broadest sense, are not limited to a chamber housing an electron beam inspection system. Rather, it is appreciated that the forgoing principles may be applied to other chambers as well.

Figure 2:
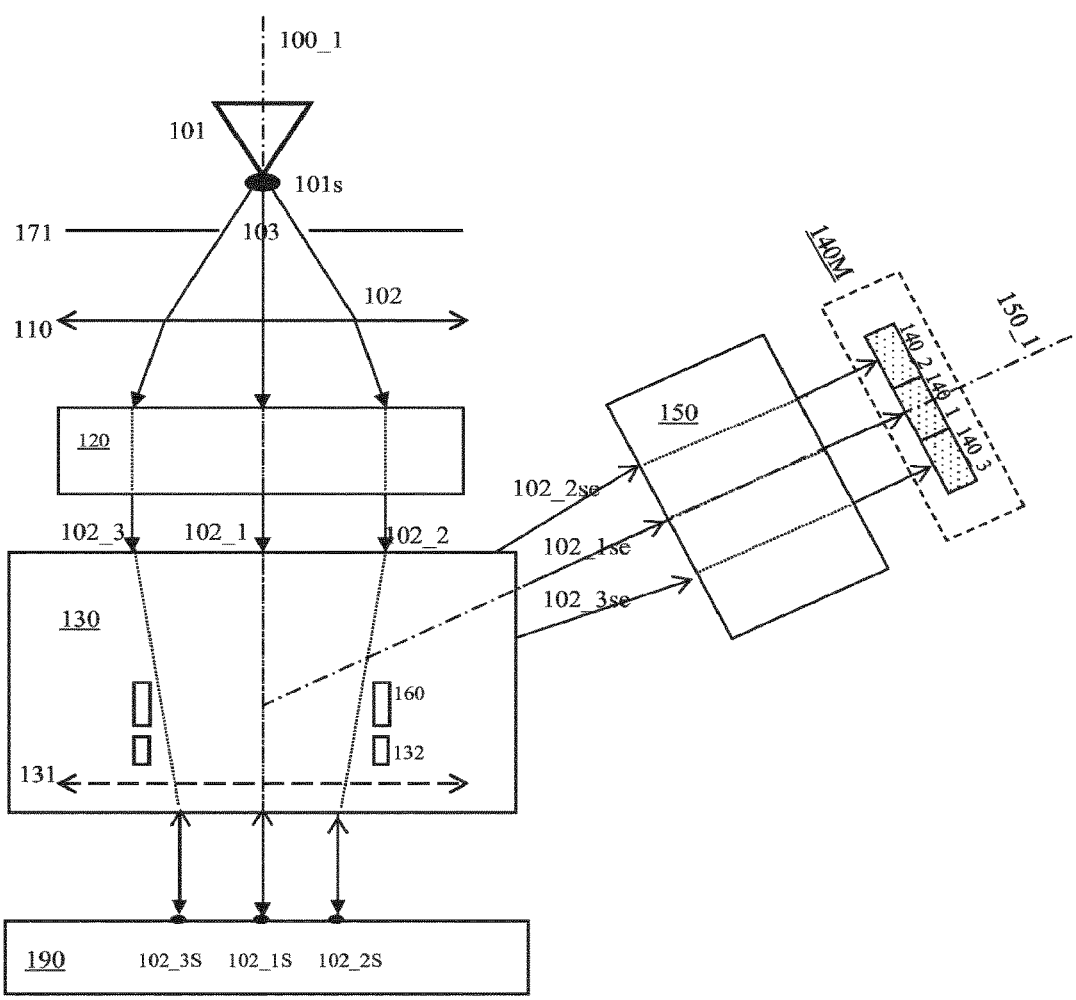
FIG. 2 is a schematic diagram illustrating an exemplary electron beam tool that can be a part of the exemplary electron beam inspection system of FIG. 1, consistent with embodiments of the present disclosure.

Reference is now made to FIG. 2, which illustrates a schematic diagram illustrating an exemplary electron beam tool that can be a part of the exemplary charged particle beam inspection system of FIG. 1, consistent with embodiments of the present disclosure. An electron beam tool 100 (also referred to herein as apparatus 100) comprises an electron source 101, a gun aperture plate 171 with a gun aperture 103, a condenser lens 110, a source conversion unit 120, a primary projection optical system 130, a sample stage (not shown in FIG. 2), a secondary optical system 150, and an electron detection device 140M. Primary projection optical system 130 can comprise an objective lens 131. Electron detection device 140M can comprise a plurality of detection elements 140_1, 140_2, and 140_3. Beam separator 160 and deflection scanning unit 132 can be placed inside primary projection optical system 130.

Electron source 101, gun aperture plate 171, condenser lens 110, source conversion unit 120, beam separator 160, deflection scanning unit 132, and primary projection optical system 130 can be aligned with a primary optical axis 100_1 of apparatus 100. Secondary optical system 150 and electron detection device 140M can be aligned with a secondary optical axis 150_1 of apparatus 100.

Electron source 101 can comprise a cathode, an extractor or an anode, wherein primary electrons can be emitted from the cathode and extracted or accelerated to form a primary electron beam 102 that forms a crossover (virtual or real) 101s. Primary electron beam 102 can be visualized as being emitted from crossover 101s.

Source conversion unit 120 can comprise an image-forming element array (not shown in FIG. 2) and a beam-limit aperture array (not shown in FIG. 2). The image-forming element array can comprise a plurality of micro-deflectors or micro-lenses to form a plurality of parallel images (virtual or real) of crossover 101s with a plurality of beamlets of primary electron beam 102. The beam-limit aperture array can limit the plurality of beamlets. FIG. 2 shows three beamlets 102_1, 102_2, and 102_3 as an example, and it is appreciated that the source conversion unit 120 can handle any number of beamlets.

Condenser lens 110 can focus primary electron beam 102. The electric currents of beamlets 102_1, 102_2, and 102_3 downstream of source conversion unit 120 can be varied by adjusting the focusing power of condenser lens 110 or by changing the radial sizes of the corresponding beam-limit apertures within the beam-limit aperture array. Objective lens 131 can focus beamlets 102_1, 102_2, and 102_3 onto a sample 190 for inspection and can form three probe spots 102_1s, 102_2s, and 102_3s on surface of sample 190. Gun aperture plate 171 can block off peripheral electrons of primary electron beam 102 not in use to reduce Coulomb effect. The Coulomb effect can enlarge the size of each of probe spots 102_1s, 102_2s, and 102_3s, and therefore deteriorate inspection resolution.

Beam separator 160 can be a beam separator of Wien filter type comprising an electrostatic deflector generating an electrostatic dipole field E1 and a magnetic dipole field B1 (both of which are not shown in FIG. 2). If they are applied, the force exerted by electrostatic dipole field E1 on an electron of beamlets 102_1, 102_2, and 102_3 is equal in magnitude and opposite in direction to the force exerted on the electron by magnetic dipole field B1. Beamlets 102_1, 102_2, and 102_3 can therefore pass straight through beam separator 160 with zero deflection angles.

Deflection scanning unit 132 can deflect beamlets 102_1, 102_2, and 102_3 to scan probe spots 102_1s, 102_2s, and 102_3s over three small scanned areas in a section of the surface of sample 190. In response to incidence of beamlets 102_1, 102_2, and 102_3 at probe spots 102_1s, 102_2s, and 102_3s, three secondary electron beams 102_1se, 102_2se, and 102_3se can be emitted from sample 190. Each of secondary electron beams 102_1se, 102_2se, and 102_3se can comprise electrons with a distribution of energies including secondary electrons (energies ≤50 eV) and backscattered electrons (energies between 50 eV and landing energies of beamlets 102_1, 102_2, and 102_3). Beam separator 160 can direct secondary electron beams 102_1se, 102_2se, and 102_3se towards secondary optical system 150. Secondary optical system 150 can focus secondary electron beams 102_1se, 102_2se, and 102_3se onto detection elements 140_1, 140_2, and 140_3 of electron detection device 140M. Detection elements 140_1, 140_2, and 140_3 can detect corresponding secondary electron beams 102_1se, 102_2se, and 102_3se and generate corresponding signals used to construct images of the corresponding scanned areas of sample 190.

Figure 3A:
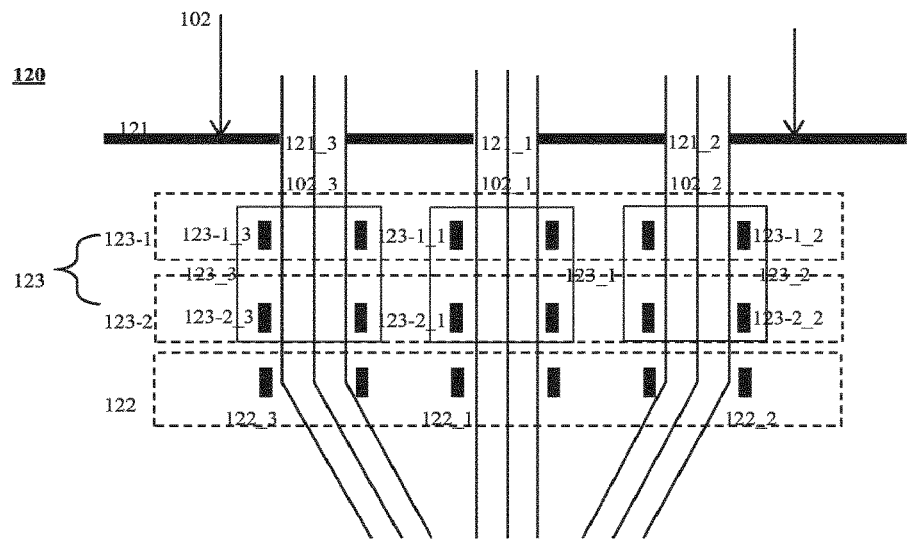
FIG. 3A is a schematic diagram illustrating a portion of an exemplary source conversion unit in a multi-beam inspection system with multiple aberration-compensator layers and an image-forming element layer, consistent with embodiments of the present disclosure.

Reference is now made to FIG. 3A, which illustrates a portion of an exemplary source conversion unit 120 in a multi-beam inspection system, consistent with embodiments of the present disclosure. As shown in FIG. 3A, source conversion unit 120 includes a beamlet-limit aperture array 121, an image-forming element array 122, and an aberration compensator array 123 provided in layers 123-1 and 123-2. Moreover, while FIG. 3A shows each of these arrays handling a 1×3 array of beamlets, it is appreciated that these arrays can handle any number of array of beamlets.

Beamlet-limit aperture array 121 includes three beamlimit apertures 121_1, 121_2, and 121_3. A parallel primary electron beam 102 is incident onto beamlet-limit aperture array 121 and divided into three beamlets 102_1, 102_2, and 102_3 via corresponding beam-limit apertures 121_1-121_3. Moreover, the pitches of beam-limit apertures 121_1-121_3 can be set to make equal pitches of probe spots on the sample surface.

Image-forming element array 122 includes three imageforming micro-deflectors 122_1, 122_2, and 122_3. Imageforming micro-deflectors 122_1-122_3 can respectively deflect beamlets 102_1-102_3 to form three images of the electron source that generates primary electron beam 102.

Aberration compensator array 123 provided in aberration-compensator layers 123-1 and 123-2 includes a plurality of micro-compensators 123_1, 123_2, and 123_3. Each of micro-compensators 123_1-123_3 comprises two sub-micro-compensators placed in layers 123-1 and 123-2. That is, micro-compensators 123_1-123_3 include sub-micro-compensators 123-1_1 and 123-2_1, 123-1_2 and 123-2_2, and 123-1_3 and 123-2_3, respectively.

Figure 3B:
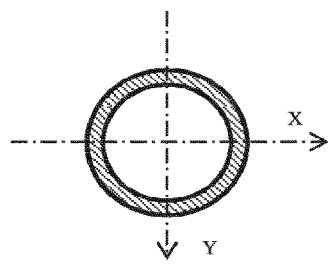
FIGS. 3B and 3C are schematic diagrams illustrating configuration of exemplary elements, consistent with embodiments of the present disclosure.
Figure 3C:
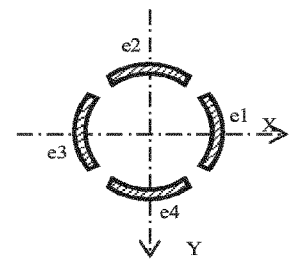

In each of micro-compensators 123_1-123_3, one of the two sub-micro-compensators (e.g., sub-micro-compensators 123-1_1 and 123-2_1) has an annular electrode structure such as that shown in FIG. 3B to function as a micro-lens, and the other has a multi-pole structure including at least four electrostatic poles or electrodes such as in FIG. 3C to function as a micro-stigmator. The annular electrode and the multi-pole structure are further described in U.S. Pat. No. 9,607,805, which is incorporated herein in its entirety. It is appreciated that the multi-pole structure of FIG. 3C can also function as a micro-lens when the same voltage is applied to all of the poles.

In each layer 123-1 and 123-2 of aberration compensator array 123, the three sub-micro-compensators do not share the same functionality. That is, for layer 123-1, the set of sub-micro-compensators 123-1_1, 123-1_2, and 123-1_3 includes at least one sub-micro-compensator functioning as a micro-lens and at least one sub-micro-compensator functioning as a micro-stigmator. For example, sub-micro-compensators 123-12, 123-13 and 123-21 could function as micro-lens while sub-micro-compensators 123-1_1, 123-2_2, and 123-2_3 could function as a micro-stigmator, or vice versa. In each of micro-compensators 123_1-123_3, the micro-lens and the micro-stigmator respectively compensate field curvature aberration and astigmatism aberration of one of beamlets 102_1-102_3. A micro-lens operates using one focusing voltage, while a micro-stigmator operates using at least two stigmatic voltages. By placing some of the micro-stigmators and some of the micro-lenses in one layer and the other micro-stigmators and the micro-lenses in another layer, circuits connecting the poles in each layer are reduced in comparison with placing all micro-stigmators in one layer and all micro-lenses in another layer. This therefore improves electrical safety.

Reference is now made to FIGS. 3B and 3C, which are schematic diagrams illustrating configuration of electrodes, consistent with embodiments of the present disclosure. In particular, FIG. 3B shows an annular electrode that is configured to function as a micro-lens when a voltage potential is applied. FIG. 3C shows a multi-pole structure with four electrodes e1-e4 that can be configured to function in different ways based on the voltages applied to each of the electrodes. For example, when one voltage is applied to all electrodes, the multi-pole structure is configured to function as a micro-lens. When two voltages of the same absolute value but opposite directions are applied to the two pairs of opposite electrodes, the multi-pole structure is configured to function as a micro-stigmator. For example, in FIG. 3C, when V1 is applied to poles e1 and e3, and when −V1 is applied to poles e2 and e4, the multi-pole structure functions as a micro-stigmator. And when a zero voltage is applied to one pair of opposite poles, and two voltages of the same absolute value but opposite directions are applied to the other pair of opposite poles, the multi-pole structure is configured to function as a micro-deflector. For example, in FIG. 3C, when e2 and e4 are applied to 0, e1 is applied to V2, and e3 is applied to −V2, the multi-pole structure functions as a micro-deflector. When operating as a microdeflector, as V2 increases, the angle of deflection of the beamlet increases as well.

Figure 4A:
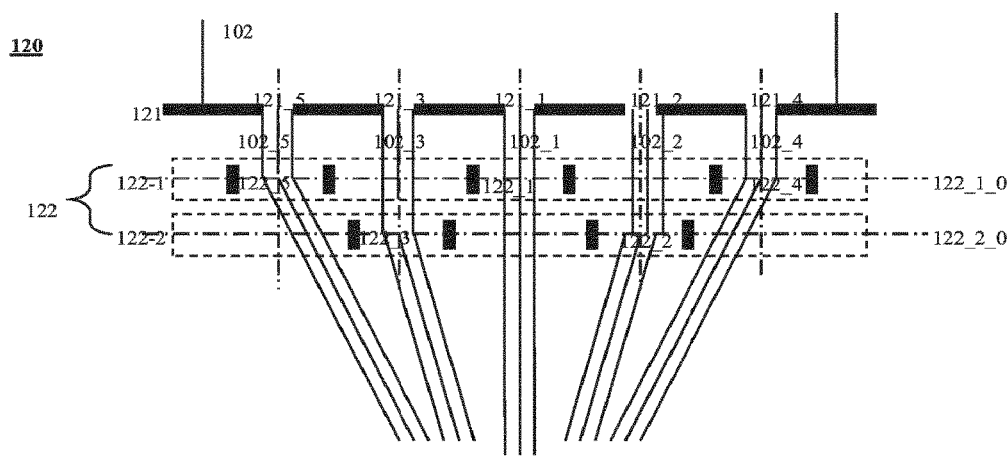
FIGS. 4A, 4B, and 4C are schematic diagrams illustrating a portion of an exemplary source conversion unit in a multi-beam inspection system with multiple image-forming layers, consistent with embodiments of the present disclosure.
Figure 4B:
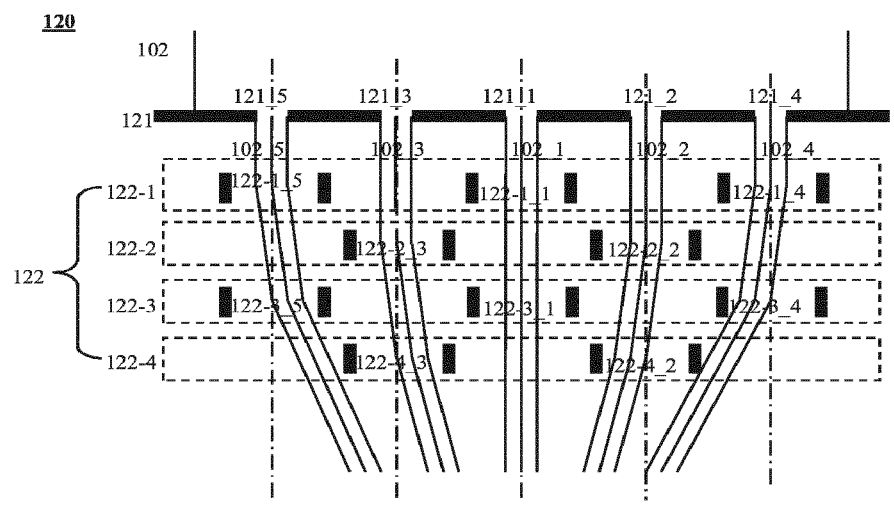
Figure 4C:
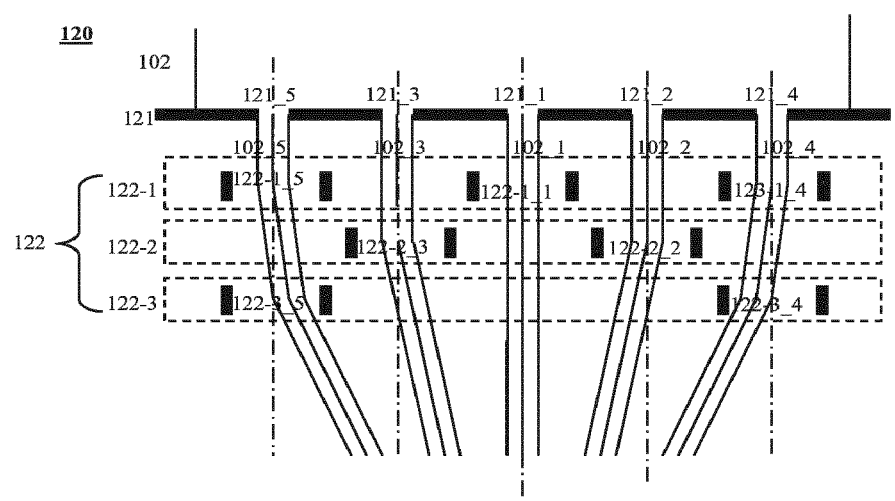

Reference is now made to FIGS. 4A, 4B and 4C, which show schematic diagrams illustrating a portion of an exemplary source conversion unit in a multi-beam inspection system with multiple image-forming layers, consistent with embodiments of the present disclosure.

As shown in FIG. 4A, source conversion unit 120 includes a beamlet-limit aperture array 121 and an image-forming element array 122. Moreover, while FIG. 4A shows each of these arrays handling a 1×5 array of beamlets, it is appreciated that these arrays can handle any number of array of beamlets.

Beamlet-limit aperture array 121 includes five beam-limit apertures 121_1, 121_2, 121_3, 121_4, and 121_5. A parallel primary electron beam 102 is incident onto beamlet-limit aperture array 121 and divided into five beamlets 102_1, 102_2, 102_3, 102_4, and 102_5 via corresponding beam-limit apertures 121_1-121_5. Moreover, the pitches of beam-limit apertures 121_1-121_5 can be set to make equal pitches of probe spots on the sample surface.

Image-forming element array 122 includes five image-forming micro-deflectors 122_1, 122_2, 122-3, 122_4, and 122_5. Image-forming micro-deflectors 122_1-122_5 can respectively deflect beamlets 102_1-102_5 to form five images of the electron source that generates primary electron beam 102. Image-forming micro-deflectors 122_1-122_5 are placed in two image-forming layers 122-1 and 122-2. Layers 122-1 and 122-2 comprise deflection planes 122_1_0 and 122_2_0 respectively. A deflection function of a deflector can be considered totally occurring on a deflection plane.

Any two adjacent beamlets of 102_1-102_5 are deflected by two of image-forming micro-deflectors 122_1-122_5 placed in two different image-forming layers, with one beamlet being deflected by image-forming micro-deflector placed in layer 122-1, and the other beamlet being deflected by image-forming micro-deflector placed in layer 122-2.

For example, image-forming micro-deflectors 122_1, 122_4, and 122_5 are placed in layer 122-1 to deflect beamlets 102_1, 102_4, and 102_5 to form three images of the electron source that generates primary electron beam 102, while image-forming micro-deflectors 122_2 and 122_3 are placed in layer 122-2 to deflect beamlets 102_2 and 102_3 to form two images of the electron source. It is appreciated that image-forming micro-deflectors 122_1, 122_4, and 122_5 can be placed in layer 122-2 to deflect beamlets 102_1, 102_4, and 102_5 to form three images of the electron source, while image-forming micro-deflectors 122_2 and 122_3 are placed in layer 122-1 to deflect 102_2 and 102_3 to form two images of the electron source.

By placing some of image-forming micro-deflectors in layer 122-1 and some other image-forming micro-deflectors in layer 122-2, the pitches of image-forming micro-deflectors 122_1-122_5 can be configured smaller than to place all image-forming micro-deflectors in one layer.

As shown in FIG. 4B, source conversion unit 120 includes a beamlet-limit aperture array 121 and an image-forming element array 122. In some embodiments, one or more elements of image-forming element array 122 are a compensator element. For example, any or all of elements 122-1_1, 122-2_2, 122-2_3, 122-1_4, 122-1_5, 122-3_1, 122-4_2, 122-4_3, 122-3_4, and 122-3_5 can be a compensator element. In some embodiments, a compensator element can include any of a micro-lens, a stigmator, or a micro-lens and a stigmator. The stigmator may be a micro-stigmator. The compensator element may be a micro-compensator. Moreover, while FIG. 4B shows each of these arrays handling a 1×5 array of beamlets, it is appreciated that these arrays can handle any number of array of beamlets.

Beamlet-limit aperture array 121 includes a plurality of beam-limit apertures 121_1, 121_2, 121_3, 121_4, and 121_5. A parallel primary electron beam 102 is incident onto beamlet-limit aperture array 121 and divided into five beamlets 102_1, 102_2, 102_3, 102_4, and 102_5 via corresponding beam-limit apertures 121_1-121_5. Moreover, the pitches of beam-limit apertures 121_1-121_5 can be set to make equal pitches of probe spots on the sample surface.

Image-forming element array 122 includes five image-forming micro-deflectors 122_1, 122_2, 122_3, 122_4, and 122_5. Each micro-deflector comprises two image-forming sub-micro-deflectors placed in two image-forming layers. All the sub-micro-deflectors are placed in four image-forming layers 122-1, 122-2, 122-3, and 122-4. As an example, image-forming sub-micro-deflectors 122-1_1, 122-1_4, and 122-1_5 of image-forming micro-deflectors 122_1, 122_4, and 122_5 are placed in layer 122-1, image-forming sub-micro-deflectors 122-2_2 and 122-2_3 of image-forming micro-deflectors 122_2 and 122_3 are placed in layer 122-2, image-forming sub-micro-deflectors 122-3_1, 122-3_4, and 122-3_5 of image-forming micro-deflectors 122_1, 122_4 and 122_5 are placed in layer 122-3, and image-forming sub-micro-deflectors 122-4_2 and 122-4_3 of image-forming micro-deflectors 122_2 and 122_3 are placed in layer 122-4. Two image-forming sub-micro-deflectors of each of image-forming micro-deflector 122_1-122_5 deflect one of beamlets 102_1-102_5 in series to form one image of the electron source that generates primary electron beam 102. The image-forming micro-deflectors 122_1-122_5 form five images of the electron source.

It is appreciated that the placement of layers and image-forming micro-deflectors can be configured to other configurations in compliance with the embodiment of the present disclosure.

Because a beamlet (such as beamlet 102_5) is deflected by two image-forming sub-micro-deflectors in series, the deflection voltages of each of the two image-forming sub-micro-deflectors (such as 122-1_5 and 122-3_5) can be smaller than that of a single corresponding image-forming micro-deflector (such as image-forming micro-deflector 122_5 of FIG. 4A), and therefore provides more electric safety. By placing image-forming sub-micro-deflectors of two adjacent image-forming micro-deflectors in four layers, the pitch of two adjacent image-forming micro-deflectors can be configured smaller than the pitch needed when placing the sub-micro-deflectors in two of the same layers.

As shown in FIG. 4C, source conversion unit 120 includes a beamlet-limit aperture array 121 and an image-forming element array 122. Moreover, while FIG. 4C shows each of these arrays handling a 1×5 array of beamlets, it is appreciated that these arrays can handle any number of array of beamlets.

Beamlet-limit aperture array 121 includes five beam-limit apertures 121_1, 121_2, 121_3, 121_4, and 121_5. A parallel primary electron beam 102 is incident onto beamlet-limit aperture array 121 and divided into five beamlets 102_1, 102_2, 102-3, 102_4, and 102_5 via corresponding beam-limit apertures 121_1-121_5. Moreover, the pitches of beam-limit apertures 121_1-121_5 can be set to make equal pitches of probe spots on the sample surface.

Image-forming element array 122 includes five image-forming micro-deflectors 122_1, 122_2, 122_3, 122_4, and 122_5, which are placed in three image-forming layers 122-1, 122-2, and 122-3. Each of two edge micro-deflectors 122_4 and 122-5 comprises two image-forming sub-micro-deflectors placed in two image-forming layers. As an example, image-forming sub-micro-deflectors 122-1_4 and 122-1_5 of edge image-forming micro-deflectors 122_4 and 122_5 and image-forming micro-deflector 122_1 (122-1_1 in FIG. 4C) are placed in layer 122-1, image-forming micro-deflectors 122_2 and 122_3 (122-2_2 and 122-23 in FIG. 4C) are placed in layer 122-2, and image-forming sub-micro-deflectors 122-3_4 and 122-3_5 of edge image-forming micro-deflectors 122_4 and 122_5 are placed in layer 122-3.

Two image-forming sub-micro-deflectors 122-1_4 and 122-3_4 of image-forming micro-deflector 122_4 deflect beamlet 102_4 in series to form one image of the electron source that generates primary electron beam 102. Two image-forming sub-micro-deflectors 122-1_5 and 122-3_5 of image-forming micro-deflector 122_5 deflect beamlet 102_5 in series to form another one image of the electron source. The image-forming micro-deflectors 122_1, 122_2, and 122_3 deflect beamlets 102_1-102_3, respectively, to form another three images of the electron source.

Because beamlets 102_4 and 102_5 are further away from the center of the source-conversion unit than the other three beamlets 102_1, 102_2 and 102_3, beamlets 102_4 and 102_5 have larger deflection angles in order to form equal pitches of probe spots on the sample surface. In FIG. 4C, beamlets 102_4 and 102_5 are deflected by two image-forming sub-micro-deflectors in series. For example, beamlet 102_4 is deflected by image-forming sub-micro-deflectors 122-1_4 and 122-3_4. Therefore, the deflection voltages of each of the two image-forming sub-micro-deflectors 122-1_4 and 122-3_4 will be smaller than that of a single image-forming micro-deflector (e.g., image-forming micro-deflector 122_4 in FIG. 4A). This further ensures electric safety. The configuration in FIG. 4A is of simpler structure than that is shown in FIG. 4B. It is appreciated that the placement of layers and image-forming micro-deflectors can be configured to other configurations in compliance with the embodiment of the present disclosure.

Meanwhile, by placing some of image-forming micro-deflectors in one image-forming layer and some other image-forming micro-deflectors in another image-forming layer, the pitches of image-forming micro-deflectors 122_1-122_5 can be configured smaller than the pitches needed when placing all image-forming micro-deflectors in one image-forming layer.

Figure 5A:
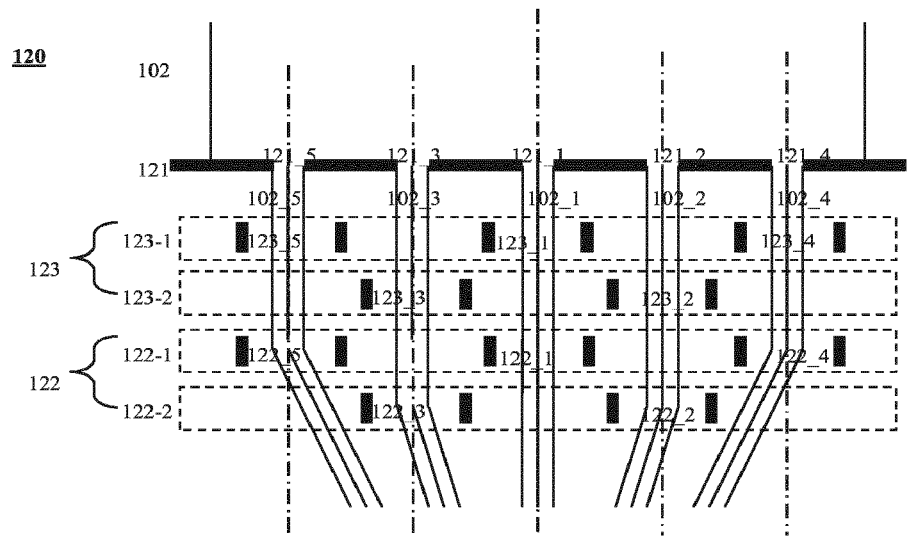
FIGS. 5A and 5B are schematic diagrams illustrating a portion of an exemplary source conversion unit in a multi-beam inspection system with multiple aberration-compensator layers and multiple image-forming layers, consistent with embodiments of the present disclosure.
Figure 5B:
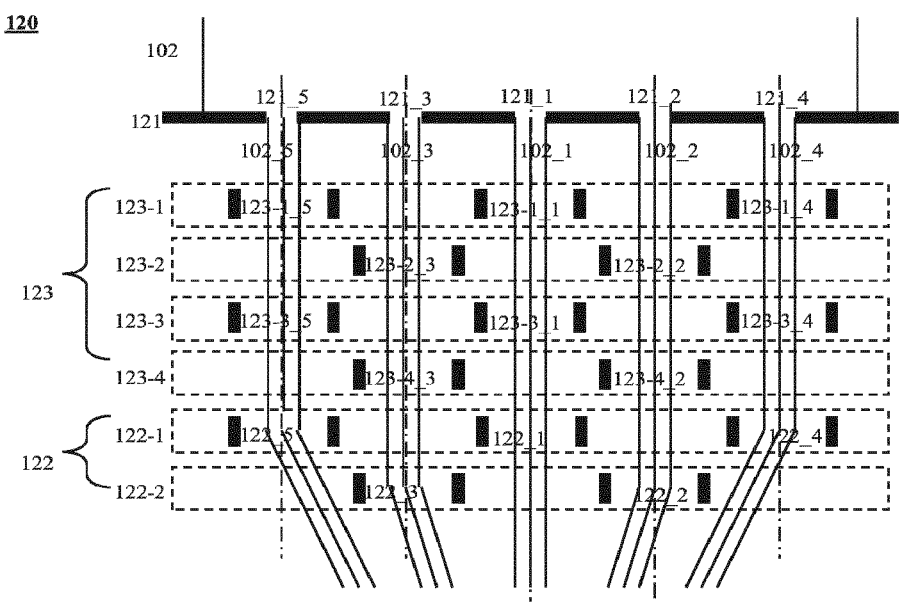

FIGS. 5A and 5B are schematic diagrams illustrating a portion of an exemplary source conversion unit in a multi-beam inspection system with multiple aberration-compensator layers and multiple image-forming layers, consistent with embodiments of the present disclosure.

Reference is now made to FIG. 5A, in which source conversion unit 120 includes a beamlet-limit aperture array 121, an image-forming element array 122, and an aberration compensator array 123. Moreover, while FIG. 5A shows each of these arrays handling a 1×5 array of beamlets, it is appreciated that these arrays can handle any number of array of beamlets.

Beamlet-limit aperture array 121 includes five beam-limit apertures 121_1, 121_2, 121_3, 121_4, and 121_5. A parallel primary electron beam 102 is incident onto beamlet-limit aperture array 121 and divided into five beamlets 102_1, 102_2, 102-3, 102-4, and 102_5 via corresponding beam-limit apertures 121_1-121_5. Moreover, the pitches of beam-limit apertures 121_1-121_5 can be set to make equal pitches of probe spots on the sample surface.

Image-forming element array 122 includes five image-forming micro-deflectors 122_1, 122-2, 122-3, 122-4 and 122_5 which are placed in two image-forming layers 122-1 and 122-2. As an example, image-forming micro-deflectors 122_1, 122_4, and 122_5 are placed in layer 122-1, and image-forming micro-deflectors 122_2 and 122_3 are placed in layer 122-2. Image-forming micro-deflectors 122_1, 122_4, and 122_5 deflect beamlets 102_1, 102_4 and 102_5, respectively, to form three images of the electron source that generates primary electron beam 102. Image-forming micro-deflectors 122_2 and 122_3 deflect beamlets 102_2 and 102_3 to form two images of the electron source.

Aberration compensator array 123 includes a plurality of micro-compensators 123_1, 123_2, 123_3, 123_4, and 123_5, which are placed in two aberration-compensator layers 123-1 and 123-2. As an example, micro-compensators 123_1, 123_4, and 123_5 are placed in layer 123-1, and micro-compensators 123_2 and 122_3 are placed in layer 123-2. Micro-compensators 123_1, 123_4, and 123_5 compensate field-curvature aberrations and/or astigmatism aberrations of beamlets 102_1, 102_4, and 102_5. Micro-compensators 123_2 and 123_3 compensate field-curvature aberrations and/or astigmatism aberrations of beamlets 102_2 and 102_3.

Meanwhile, by placing some of image-forming micro-deflectors in one image-forming layer and some other image-forming micro-deflectors in another image-forming layer, and placing some of micro-compensators in one aberration-compensator layer and some other micro-compensators in another aberration-compensator layer, the pitches of image-forming micro-deflectors and micro-compensators can be configured smaller than the pitches needed if all image-forming micro-deflectors are placed in one image-forming layer and all micro-compensators are placed in one aberration-compensator layer.

Reference is now made to FIG. 5B. The source conversion unit 120 includes a beamlet-limit aperture array 121, an image-forming element array 122, and an aberration compensator array 123. Moreover, while FIG. 5B shows each of these arrays handling a 1×5 array of beamlets, it is appreciated that these arrays can handle any number of array of beamlets.

Beamlet-limit aperture array 121 includes five beam-limit apertures 121_1, 121_2, 121_3, 121_4, and 121_5. A parallel primary electron beam 102 is incident onto beamlet-limit aperture array 121 and divided into five beamlets 102_1, 102_2, 102_3, 102_4, and 102_5 via corresponding beam-limit apertures 121_1-121_5. Moreover, the pitches of beam-limit apertures 121_1-121_5 can be set to make equal pitches of probe spots on the sample surface.

Image-forming element array 122 includes five image-forming micro-deflectors 122_1, 122_2, 122_3, 122-4 and 122_5 which are placed in image-forming layers 122-1 and 122-2. As an example, image-forming micro-deflectors 122_1, 122_4, and 122_5 are placed in layer 122-1, and image-forming micro-deflectors 122_2 and 122_3 are placed in layer 122-2. Image-forming micro-deflectors 122_1, 122_4 and 122_5 deflect beamlets 102_1, 102_4 and 102_5 to form three images of the electron source that generates the primary electron beam 102. Image-forming micro-deflectors 122_2 and 122_3 deflect beamlets 102_2 and 102_3 to form two images of the electron source.

Aberration compensator array 123 includes five micro-compensators 123_1, 123_2, 123_3, 123_4, and 123_5 which are placed in four aberration-compensator layers 123-1, 123-2, 123-3, and 123-4. Each micro-compensator of 123_1-123_5 comprises two sub-micro-compensators being placed in two of the four aberration-compensator layers. As an example, micro-compensator 123_1 includes sub-micro-compensators 123-1_1 and 123-3_1 in layers 123-1 and 123-3, micro-compensator 123_2 includes sub-micro-compensators 123-2_2 and 123-4_2 in layers 123-2 and 123-4, micro-compensator 123_3 includes sub-micro-compensators 123-2_3 and 123-4_3 in layers 123-2 and 123-4, micro-compensator 123_4 includes sub-micro-compensators 123-1_4 and 123-3_4 in layers 123-1 and 123-3, and micro-compensator 123_5 includes sub-micro-compensators 123-1_5 and 123-3_5 in layers 123-1 and 123-3.

In each of micro-compensators 123_1-123_5, one of the two sub-micro-compensators (e.g., sub-micro-compensator 123-1_1 and 123-3_1) has an annular electrode structure such as shown in FIG. 3B or FIG. 3C (where the same voltage is applied to all electrostatic poles) to function as a micro-lens, and the other has a multi-pole structure including at least four electrostatic poles such as in FIG. 3C to function as a micro-stigmator. In each of micro-compensators 123_1-123_5, the sub-micro-compensator functioning as a micro-lens compensates field curvature aberration and the sub-micro-compensator functioning as a micro-stigmator compensates astigmatism aberration of corresponding one of beamlets 102_1-102_5.

The sub-micro-compensators of two adjacent micro-compensators handling two adjacent beamlets are not placed in same layers. For example, sub-micro-compensators 123-1_5 and 123-3_5 of micro-compensator 123_5 are placed in layers 123-1 and 123-3, while sub-micro-compensators 123-2_3 and 123-4_3 of micro-compensator 123_3 are placed in layers 123-2 and 123-4.

The sub-micro-compensators in the same layers can be configured to have the same functions. For example, in layer 123-1, all sub-micro-compensators 123-1_1, 123-1_4 and 123-1_5 are configured to function as micro-lens. The sub-micro-compensators in the same layers can also be configured to have different functions. For example, in layer 123-1, sub-micro-compensators 123-1_1 and 123-1_4 are configured to function as a micro-lens respectively, and sub-micro-compensators 123-1_5 is configured to function as a micro-stigmator. However, because circuits needed to connect electrodes in each layer are fewer when sub-micro-compensators in the same layer are configured to function differently than when sub-micro-compensators in the same layer are configured to function the same, electric safety is higher when sub-micro-compensators in the same layer are configured to function differently.

Meanwhile, by placing adjacent image-forming micro-deflectors in different image-forming layers and placing sub-micro-compensators of adjacent micro-compensators in different aberration-compensator layers, the pitches of image-forming micro-deflectors and micro-compensators can be configured smaller than the pitches needed if all image-forming micro-deflectors are placed in one image-forming layer and all of micro-compensators are placed in one aberration-compensator layer.

Figure 6A:
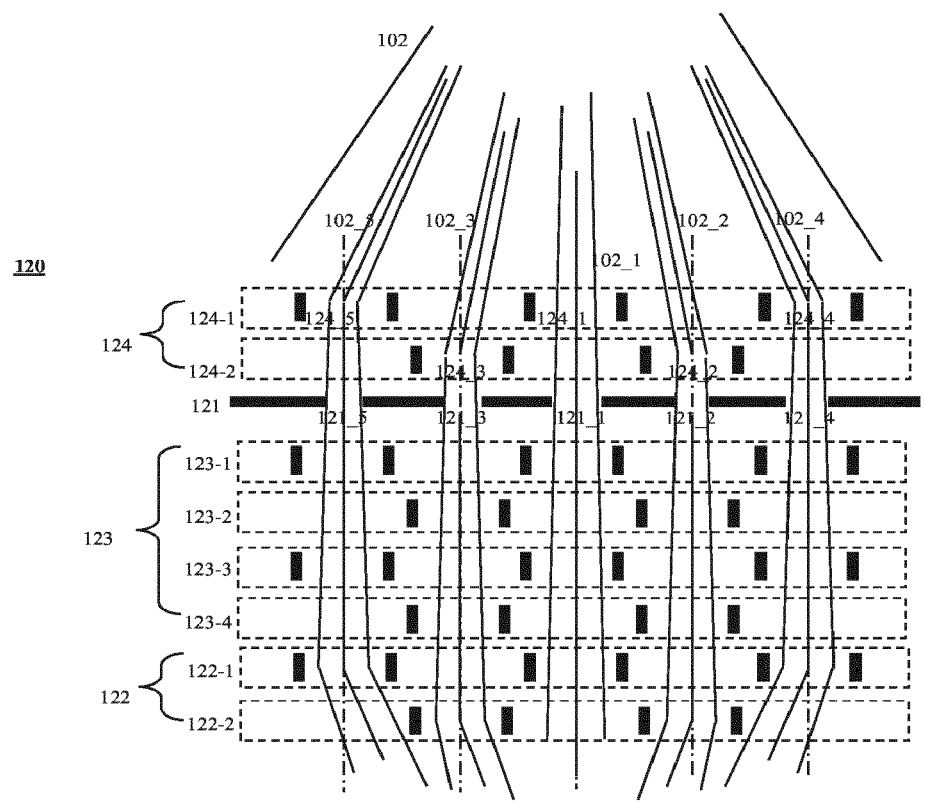
FIGS. 6A, 6B, and 6C are schematic diagrams illustrating portion of an exemplary source conversion unit in a multi-beam inspection system with multiple pre-bending layers, multiple aberration-compensator layers and multiple image-forming layers, consistent with embodiments of the present disclosure.
Figure 6B:
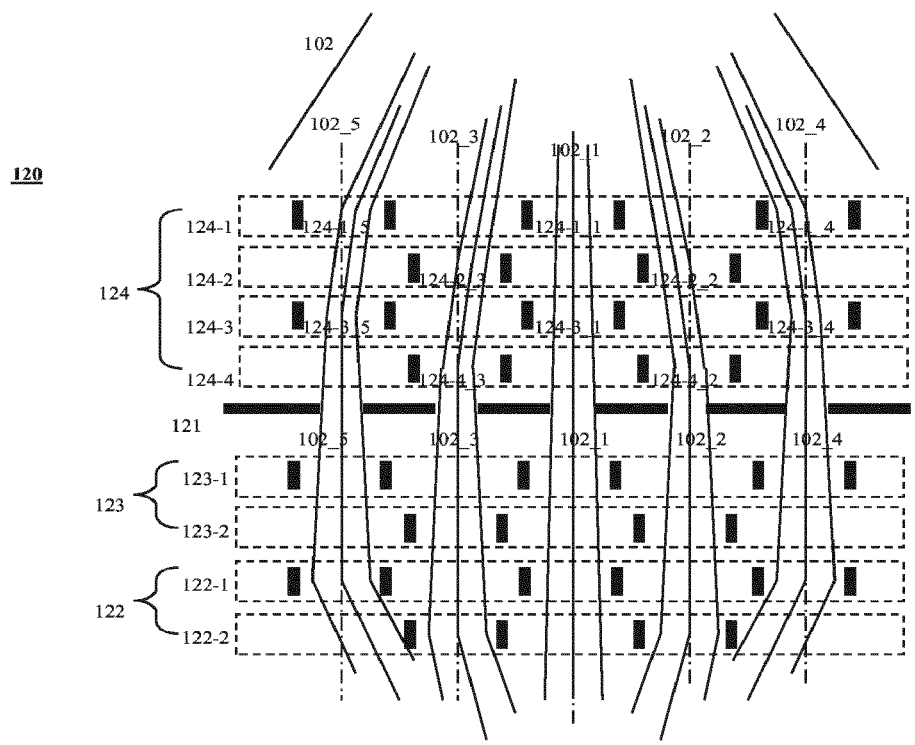
Figure 6C:
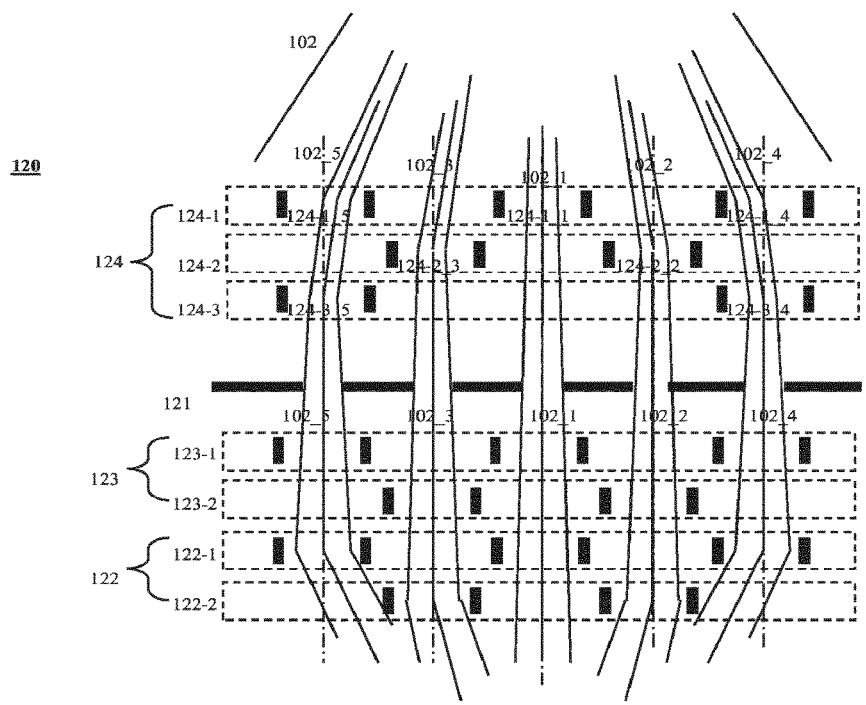

FIGS. 6A, 6B, and 6C are schematic diagrams illustrating a portion of an exemplary source conversion unit in a multi-beam inspection system, consistent with embodiments of the present disclosure.

Reference is now made to FIG. 6A, which shows a source conversion unit 120 that includes a beamlet-limit aperture array 121, an image-forming element array 122, an aberration compensator array 123, and a pre-bending element array 124. Moreover, while FIG. 6A shows each of these arrays handling a 1×5 array of beamlets, it is appreciated that these arrays can handle any number of array of beamlets.

Pre-bending element array 124 includes five pre-bending micro-deflectors 124_1, 124_2, 124_3, 124_4, and 124_5, which are placed in two pre-bending layers 124-1 and 124-2. As an example, pre-bending micro-deflectors 124_1, 124_4, and 124_5 are placed in layer 124-1, and pre-bending micro-deflectors 124_2 and 124_3 are placed in layer 124-2.

A divergent primary electron beam 102 is incident onto pre-bending element array 124. Pre-bending micro-deflectors 124_1, 124_4, and 124_5 deflect beamlets 102_1, 102_4 and 102_5 of primary electron beam 102 to perpendicularly enter beam-limit apertures 121_1, 121_4, and 121_5 of beamlet-limit aperture array 121. Pre-bending micro-deflectors 124_2 and 124_3 deflect beamlets 102_2 and 102_3 of primary electron beam 102 to perpendicularly enter beam-limit apertures 121_2 and 121_3 of beamlet-limit aperture array 121.

Beam-limit apertures 121_1-121_5 limit beamlets 102-1-102-5. Moreover, the pitches of beam-limit apertures 121_1-121_5 can be set to make equal pitches of probe spots on the sample surface.

Image-forming element array 122 includes five image-forming micro-deflectors 122_1, 122_2, 122_3, 122-4, and 122_5 which are placed in two image-forming layers 122-1 and 122-2. As an example, image-forming micro-deflectors 122_1, 122_4, and 122_5 are placed in layer 122-1, and image-forming micro-deflectors 122_2 and 122_3 are placed in layer 122-2. Image-forming micro-deflectors 122_1, 122_4, and 122_5 deflect beamlets 102_1, 102_4 and 102_5 to form three images of the electron source that generates primary electron beam 102. Image-forming micro-deflectors 122_2 and 122_3 deflect beamlets 102_2 and 102_3 to form two images of the electron source.

Aberration compensator array 123 includes five micro-compensators 123_1, 123_2, 123_3, 123_4, and 123_5, which are placed in four aberration-compensator layers 123-1, 123-2, 123-3, and 123-4. Each of micro-compensator 123_1-123_5, comprises two sub-micro-compensators being placed in two of the four aberration-compensator layers. As an example, micro-compensator 123_1 includes sub-micro-compensators 123-1_1 and 123-3_1 in layers 123-1 and 123-3, micro-compensator 123_2 includes sub-micro-compensators 123-2_2 and 123-4_2 in layers 123-2 and 123-4, micro-compensator 123_3 includes sub-micro-compensators 123-2_3 and 123-4_3 in layers 123-2 and 123-4, micro-compensator 123_4 includes sub-micro-compensators 123-1_4 and 123-3_4 in layers 123-1 and 123-3, and micro-compensator 123_5 includes sub-micro-compensators 123-15 and 123-3_5 in layers 123-1 and 123-3.

In each of micro-compensators 123_1-123_5, one of the two sub-micro-compensators (e.g., sub-micro-compensators 123-1_1 and 123-3_1) has an annular electrode structure such as shown in FIG. 3B or FIG. 3C (when the same voltage is applied to all electrodes) to function as a micro-lens, and the other has a multi-pole structure including at least four electrodes such as in FIG. 3C to function as a micro-stigmator. In each of micro-compensators 123_1-123_5, the sub-micro-compensator functioning as a micro-lens compensates field curvature aberration and the sub-micro-compensator functioning as a micro-stigmator compensates astigmatism aberration of corresponding one of beamlets 102_1-102_5.

The sub-micro-compensators of two adjacent micro-compensators handling two adjacent beamlets are not placed in the same layers. For example, sub-micro-compensators 123-15 and 123-3_5 of micro-compensator 123_5 are placed in layers 123-1 and 123-3, while sub-micro-compensators 123-2_3 and 123-4_3 of micro-compensator 123_3 are placed in layers 123-2 and 123-4.

The sub-micro-compensators in the same layers can be configured to have the same functions. For example, in layer 123-1, all sub-micro-compensators 123-1_1, 123-1_4 and 123-1_5 are configured to function as micro-lens. The sub-micro-compensators in the same layers can also be configured to have different functions. For example, in layer 123-1, sub-micro-compensators 123-1_1 and 123-14 are configured to function as a micro-lens respectively, and sub-micro-compensator 123-1_5 is configured to function as a micro-stigmator. However, because circuits needed to connect electrodes in each layer are fewer when sub-micro-compensators in the same layer are configured to function differently than when sub-micro-compensators in the same layer are configured to function the same, electric safety is higher when sub-micro-compensators in the same layer are configured to function differently.

Meanwhile, by placing adjacent image-forming micro-deflectors in different image-forming layers, placing sub-micro-compensators of adjacent micro-compensators in different aberration-compensator layers and placing adjacent pre-bending micro-deflectors in different pre-bending layers, the pitches of image-forming micro-deflectors, micro-compensators and pre-bending micro-deflectors can be configured smaller than the pitches needed if all image-forming micro-deflectors are placed in one image-forming layer, all micro-compensators are placed in one aberration-compensator layer, and all pre-bending micro-deflectors are placed in one pre-bending layer.

Reference is now made to FIG. 6B, which shows a source conversion unit 120 that includes a beamlet-limit aperture array 121, an image-forming element array 122, an aberration compensator array 123, and a pre-bending element array 124. Moreover, while FIG. 6B shows each of these arrays handling a 1×5 array of beamlets, it is appreciated that these arrays can handle any number of array of beamlets.

Pre-bending element array 124 includes five pre-bending micro-deflectors 124_1, 124_2, 124_3, 124_4, and 124_5, which are placed in four pre-bending layers 124-1, 124-2, 124-3, and 124-4. Each pre-bending micro-deflector is further configured to comprise two sub-micro-deflectors placed in two of the four pre-bending layers. For example, pre-deflector 124_1 comprises sub-micro-deflector 124-1_1 in layer 124-1 and sub-micro-deflector 124-3_1 in layer 124-3.

Two pre-bending sub-micro-deflectors of each pre-bending micro-deflector deflect one beamlet of a divergent primary electron beam 102. Pre-bending sub-micro-deflectors 124-1_1, 124-1_4 and 124-1_5 in layer 124-1 and pre-bending sub-micro-deflectors 124-3_1, 124-3_4 and 124-3_5 in layer 124-3 are configured to deflect beamlets 102_1, 102_4 and 102_5 of the primary electron beam 102 in series respectively to perpendicularly enter beam-limit apertures 121_1, 121_4 and 121_5 of beamlet-limit aperture array 121. And pre-bending sub-micro-deflectors 124-2_2 and 124-2_3 in layer 124-2 and pre-bending sub-micro-deflectors 124-4_2 and 124-4_3 in layer 124-4 are configured to deflect beamlets 102_2 and 102_3 of the primary electron beam 102 in series respectively to perpendicularly enter beam-limit apertures 121_2 and 121_3 of beamlet-limit aperture array 121. It is appreciated that the placement of pre-bending layers and pre-bending micro-deflectors comprising sub-micro-deflectors can be configured to other configurations in compliance with the embodiment of the present disclosure.

Because each of beamlets 102_1-102_5 is deflected by two pre-bending sub-micro-deflectors, the deflection voltages of each of the two pre-bending sub-micro-deflectors (e.g., pre-bending sub-micro-deflectors 124-1_4 and 124-3_4) will be smaller than that of a single pre-bending micro-deflector (e.g., pre-bending micro-deflector 124_4 in FIG. 6A). This ensures electric safety. It is appreciated that the placement of layers and pre-bending micro-deflectors can be configured to other configurations in compliance with the embodiment of the present disclosure.

Five beam-limit apertures 121_1-121_5 limit beamlets 102_1-102_5, respectively. Moreover, the pitches of beam-limit apertures 121_1-121_5 can be set to make equal pitches of probe spots on the sample surface.

Image-forming element array 122 includes five image-forming micro-deflectors 122_1, 122_2, 122_3, 122_4, and 122_5, which are placed in two image-forming layers 122-1 and 122-2. As an example, image-forming micro-deflectors 122_1, 122_4, and 122_5 are placed in layer 122-1, image-forming micro-deflectors 122_2 and 122_3 are placed in layer 122-2. Image-forming micro-deflectors 122_1, 122_4 and 122_5 deflect beamlets 102_1, 102_4 and 102_5 to form three images of the electron source that generates primary electron beam 102. Image-forming micro-deflectors 122_2 and 122_3 deflect beamlets 102_2 and 102_3 to form two images of the electron source.

Aberration compensator array 123 includes five micro-compensators 123_1, 123_2, 123_3, 123_4, and 123_5 which are placed in two aberration-compensator layers 123-1 and 123-2. As an example, micro-compensators 123_1, 123_4, and 123_5 are placed in layer 123-1, and micro-compensators 123_2 and 122_3 are placed in layer 123-2. Micro-compensators 123_1, 123_4 and 123_5 compensate field-curvature aberrations and astigmatism aberrations of beamlets 102_1, 102_4, and 102_5. Micro-compensators 123_2 and 1233 compensate field-curvature aberrations and astigmatism aberrations of beamlets 102_2 and 102_3.

Reference is now made to FIG. 6C, which shows a source conversion unit 120 that includes a beamlet-limit aperture array 121, an image-forming element array 122, an aberration compensator array 123, and a pre-bending element array 124. Moreover, while FIG. 6C shows each of these arrays handling a 1×5 array of beamlets, it is appreciated that these arrays can handle any number of array of beamlets.

Pre-bending element array 124 includes five pre-bending micro-deflectors 124_1, 124_2, 124_3, 124_4, and 124_5 placed in three pre-bending layers 124-1, 124-2, and 124-3. Each of two outmost pre-bending micro-deflectors 124_4 and 124_5 comprises two pre-bending sub-micro-deflectors in different layers. As an example, pre-bending micro-deflectors 124_1 (124-1_1 in FIG. 6C) is placed in layer 124-1, pre-bending micro-deflectors 124_2 (124-2_2 in FIG. 6C) and 124_3 (124-2_3 in FIG. 6C) are placed in layer 124-2, sub-micro-deflectors 124-1_5 and 124-3_5 of outmost pre-bending micro-deflector 124_5 are placed in layers 124-1 and 124-3 and sub-micro-deflectors 124-1_4 and 124-3_4 of outmost pre-bending micro-deflector 124_4 are placed in layers 124-1 and 124-3.

A divergent primary beam 102 is incident onto pre-bending element array 124. Beamlets 102_1, 102_2, and 102_3 of primary beam 102 are deflected by pre-bending micro-deflector 124_1, 124_1, and 124_3 to perpendicularly enter beam-limit apertures 121_1, 121_2 and 121_3 of beamlet-limit aperture array 121. Beamlets 102_4 and 102_5 of primary electron beam 102 are respectively deflected by pre-bending sub-micro-deflectors 124-1_4 and 124-34 of pre-bending micro-deflector 124_4 in series, and pre-bending sub-micro-deflectors 124-1_5 and 124-3_5 of pre-bending micro-deflector 124_5 in series to perpendicularly enter beam-limit apertures 121_4 and 121_5 of beamlet-limit aperture array 121.

Because beamlets 102_4 and 102_5 are further away from the center of the source-conversion unit than the three inner beamlets 102_1, 102_2 and 102_3, therefore beamlets 102_4 and 102_5 have larger deflection angles. Because each of beamlets 102_4 and 102_5 is deflected by two pre-bending sub-micro-deflectors in series, the deflection voltages of each of the two pre-bending sub-micro-deflectors will be smaller than that of one pre-bending micro-deflector in FIG. 6A, and therefore provide more electric safety. The configuration in FIG. 6C is of simpler structure than that shown in FIG. 6B. It is appreciated that the placement of pre-bending layers and pre-bending micro-deflectors can be configured to other configurations in compliance with the embodiment of the present disclosure.

Beam-limit apertures 121_1-121_5 limit beamlets 102_1-102_5 respectively. Moreover, the pitches of beam-limit apertures 121_1-121_5 can be set to make equal pitches of probe spots on the sample surface.

Image-forming element array 122 includes five image-forming micro-deflectors 122_1, 122_2, 122_3, 122_4, and 122_5, which are placed in two image-forming layers 122-1 and 122-2. As an example, image-forming micro-deflectors 122_1, 122_4, and 122_5 are placed in layer 122-1, and image-forming micro-deflectors 122_2 and 122_3 are placed in layer 122-2. Image-forming micro-deflectors 122_1, 122_4 and 122_5 deflect beamlets 102_1, 102_4 and 102_5 to form three images of the electron source that generates primary electron beam 102. Image-forming micro-deflectors 122_2 and 122_3 deflect beamlets 102_2 and 102_3 to form two images of the electron source.

Aberration compensator array 123 includes five micro-compensators 123_1, 123_2, 123_3, 123_4, and 123_5, which are placed in two aberration-compensator layers 123-1 and 123-2. As an example, micro-compensators 123_1, 123_4, and 123_5 are placed in layer 123-1, and micro-compensators 123_2 and 122_3 are placed in layer 123-2. Micro-compensators 123_1, 123_4, and 123_5 compensate field-curvature aberrations and/or astigmatism aberrations of beamlets 102_1, 102_4 and 102_5. Micro-compensators 123_2 and 123_3 compensate field-curvature aberrations and/or astigmatism aberrations of beamlets 102_2 and 102_3.

Figure 7:
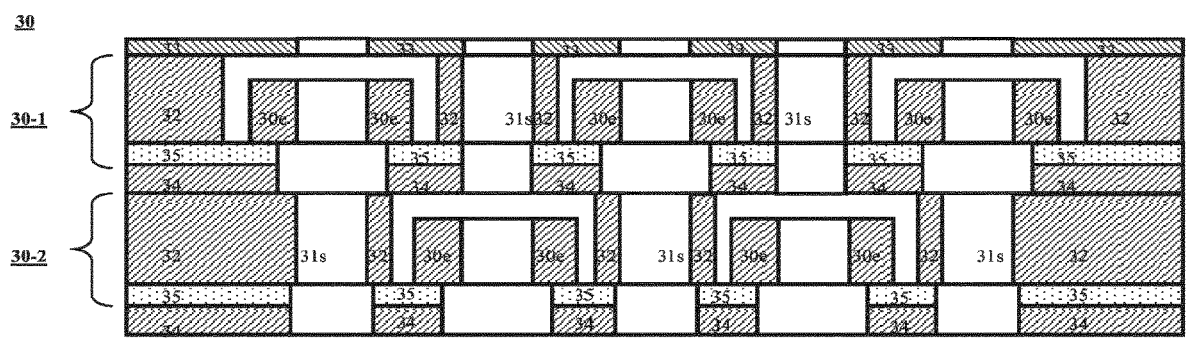
FIG. 7 is a schematic diagram illustrating a configuration of a portion of an exemplary source conversion unit in a multi-beam inspection system with multiple layers.

FIG. 7 is a schematic diagram illustrating a configuration of a portion of an array structure of a source conversion unit in a multi-beam inspection system, consistent with embodiments of the present disclosure. In particular, FIG. 7 shows an exemplary structure of an element array 30 provided in two layers 30-1 and 30-2 with electrostatic shielding. It is appreciated that the structure of element array 30 can be used for an image-forming element array (e.g., image-forming element array 122 of FIG. 4A), an aberration compensator array (e.g., aberration compensator array 123 of FIG. 5A), or a pre-bending element array (e.g., pre-bending element array 124 of FIG. 6A). While FIG. 7 only shows an array provided in two layers having a particular element arrangement, it is appreciated that further layers with various element arrangements that are consistent with the embodiments described herein can be added. Moreover, while FIG. 7 shows five beamlet path holes 31s, it is appreciated that any number of an array of beamlet path holes can be used.

FIG. 7 shows a number of elements 30e across the layers 30-1 and 30-2. For example, layer 30-1 of structure 30 includes three elements 30e corresponding to the first, third, and fifth beamlet path holes 31s, while layer 30-2 includes two elements 30e corresponding to the second and fourth beamlet path holes 31s. Depending on the type of array, elements 30e can function as a micro-deflector involving two or more segmented electrodes as shown in FIG. 3C, a micro-stigmator involving four or more segmented electrodes as shown in FIG. 3C, or a micro-lens involving one or more annular electrode shown in FIG. 3B or FIG. 3C (when the same voltage is applied to all of the electrodes). Each of elements 30e can generate an electrostatic field. For example, electrode 30e could generate a dipole field when functioning as a micro-deflector, a quadrupole field when functioning as micro-stigmator, or a round-lens field when functioning as a micro-lens.

To avoid cross-talks of electrostatic fields of elements 30e, electric shielding to each element 30e is preferred. To provide electrostatic shielding to each element 30e via an electric shielding cavity, the structure of element array 30 includes electric-conduction plates 32, 33, 34 having though holes 31s. Electric-conduction plate 32 can act as an electrode-holding plate that provides electrostatic shielding for elements 30e, while electric-conduction plates 33 and 34 can act as an electrode-covering plate that control electrostatic fringe fields generated by elements 30e. The combination of plates 32-34 can remove the cross-talk of electrostatic fields generated by elements 30e. Electric-conduction plates 32-34 can also operate at the same potential (such as ground potential) and enable the symmetric distributions of electrostatic fields, such as rotation symmetric for a micro-deflector and micro-stigmator, and axisymmetric for a micro-lens. Moreover, for each layer, array 30 can include an isolator lamina 35 that can provide insulating lamination isolating the electrodes from conduction plate 34.

Figure 8A:
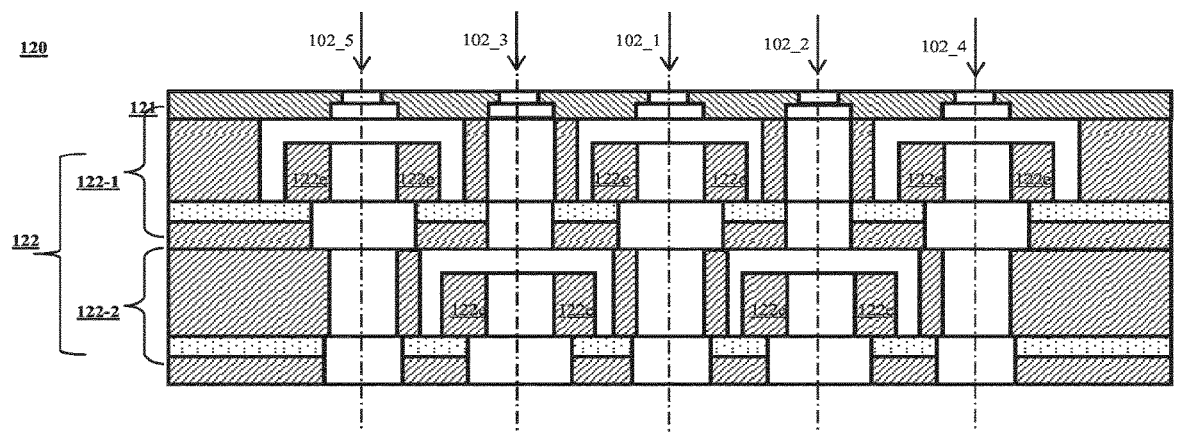
FIG. 8A is a schematic diagram illustrating a configuration of a portion of an exemplary source conversion unit in a multi-beam inspection system with multiple image-forming layers, consistent with embodiments of the present disclosure.

FIG. 8A is a diagram illustrating an exemplary structure of a portion of an exemplary source conversion unit in a multi-beam inspection system, consistent with embodiments of the present disclosure. In particular, FIG. 8A shows a beam-limit aperture array 121 and an image-forming element array 122 similar to array structure 30 of FIG. 7.

Beam-limit aperture array 121 includes a plurality of beam-limit apertures (e.g., beam-limit apertures 121_1-121_5 of FIG. 4A). Beam-limit aperture array 121 can be formed by the top electric conduction plate (e.g., conduction plate 33 of FIG. 7) with through holes. To reduce the electron scattering of beamlets 102_1, 102_2, 102_3, 102_4, and 102-5, the through holes of beam-limit aperture array 121 can be created using a thin-edge of an upside down counterbore.

Image-forming element array 122 is provided in layer 122-1 and layer 122-2 with electrostatic shielding arrangement similar to FIG. 7. It is appreciated that the structure of image-forming element array corresponds to the image-forming element array of FIG. 4A. The structure of image-forming element array 122 includes elements 122e, which can function as micro-deflector involving two or more segmented electrodes as shown in FIG. 3C. Each of these micro-deflectors can deflect corresponding one of beamlets 102_1-102_5.

Figure 8B:
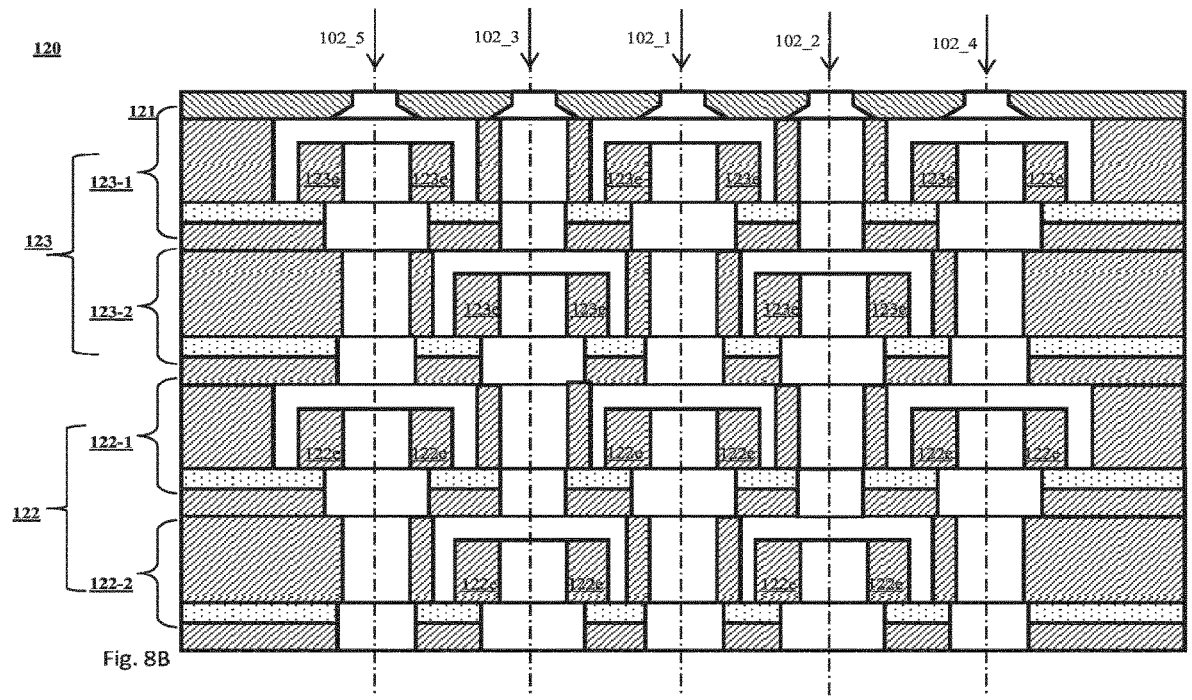
FIGS. 8B and 8C are schematic diagrams illustrating a configuration of a portion of an exemplary source conversion unit in a multi-beam inspection system with multiple aberration-compensator layers and multiple image-forming layers, consistent with embodiments of the present disclosure.

FIG. 8B is a diagram illustrating an exemplary structure of a portion of an exemplary source conversion unit in a multi-beam inspection system, consistent with embodiments of the present disclosure. In particular, FIG. 8B shows a beam-limit aperture array 121, an image-forming element array 122 similar to array structure 30 of FIG. 7, and an aberration compensator array 123 similar to array structure 30 of FIG. 7. It is appreciated that the structure of source conversion unit in FIG. 8B corresponds to the source conversion unit of FIG. 5A.

Beam-limit aperture array 121 includes a plurality of beam-limit apertures (e.g., beam-limit apertures 121_1-121_5 of FIG. 5A). Beam-limit aperture array 121 can be formed by the top electric conduction plate (e.g., conduction plate 33 of FIG. 7) with through holes. To reduce the electron scattering of beamlets 102_1, 102_2, 102_3, 102_4, and 102-5, the through holes of beam-limit aperture array 121 can be formed using a thin edge of an upside-down funnel.

Aberration compensator array 123 is provided in layer 123-1 and layer 123-2 with electrostatic shielding arrangement similar to FIG. 7. It is appreciated that the structure of aberration compensator array corresponds to the aberration compensator array of FIG. 5A. The structure of aberration compensator array 123 includes elements 123e, which can function as micro-compensators that include a micro-stigmator involving four or more segmented electrodes as shown in FIG. 3C, or a micro-lens involving one or more annular electrode shown in FIG. 3B or FIG. 3C (when the same voltage is applied to all of the electrodes). Each of these micro-compensators can compensate aberrations of corresponding one of beamlets 102_1-102_5.

Image-forming element array 122 is provided in layer 122-1 and layer 122-2 with electrostatic shielding arrangement similar to FIG. 7. It is appreciated that the structure of image-forming element array corresponds to the image-forming element array of FIG. 5A. The structure of image-forming element array 122 includes elements 122e, which can function as micro-deflector involving two or more segmented electrodes as shown in FIG. 3C. Each of these micro-deflectors can deflect corresponding one of beamlets 102_1-102_5.

Figure 8C:
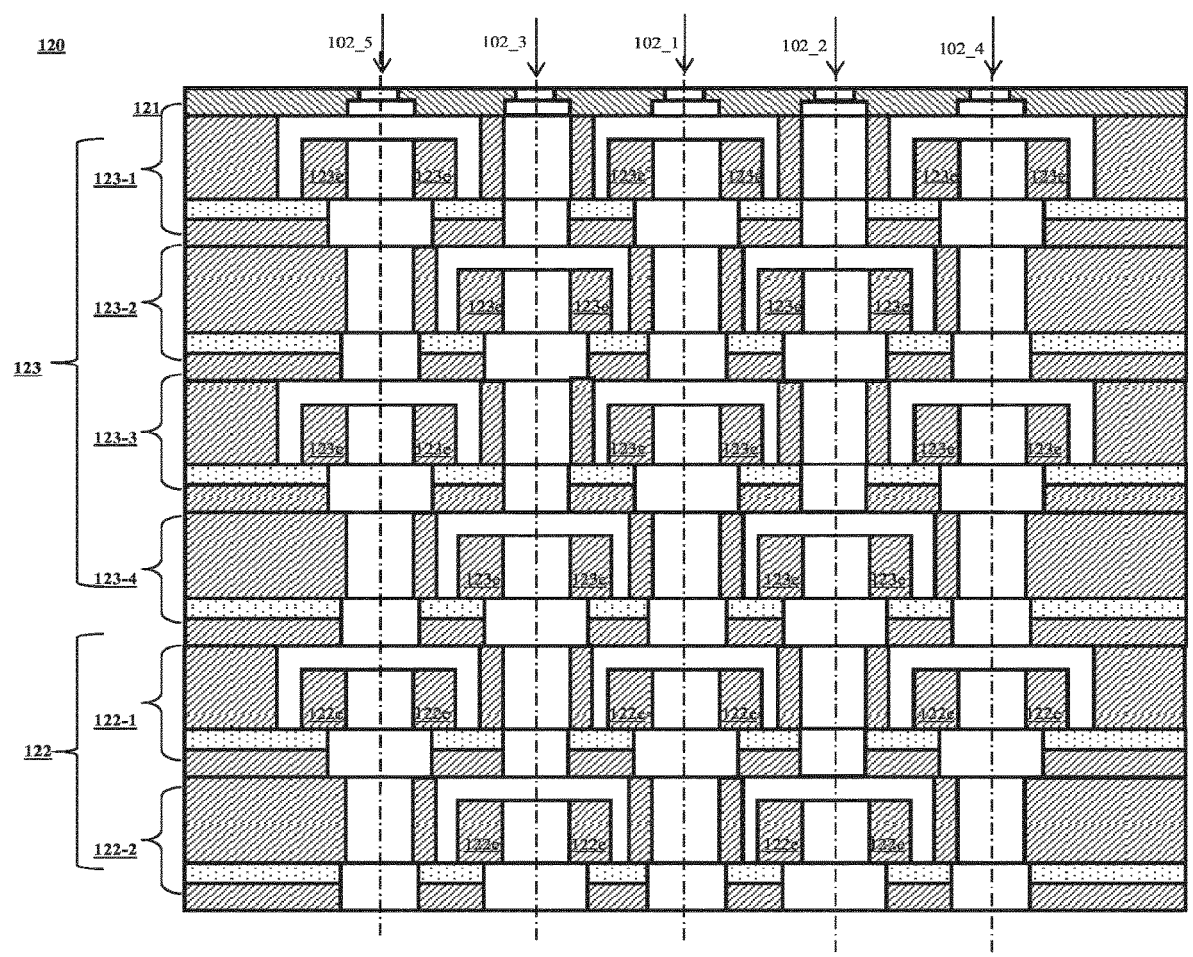

FIG. 8C is a diagram illustrating an exemplary structure of a portion of an exemplary source conversion unit in a multi-beam inspection system, consistent with embodiments of the present disclosure. In particular, FIG. 8C shows a beam-limit aperture array 121, an image-forming element array 122 similar to array structure 30 of FIG. 7, and an aberration compensator array 123 similar to array structure 30 of FIG. 7 while having more layers. It is appreciated that the structure of source conversion unit in FIG. 8C corresponds to the source conversion unit of FIG. 5B.

Beam-limit aperture array 121 includes a plurality of beam-limit apertures (e.g., beam-limit apertures 121_1-121_5 of FIG. 5B). Beam-limit aperture array 121 can be formed by the top electric conduction plate (e.g., conduction plate 33 of FIG. 7) with through holes. To reduce the electron scattering of beamlets 102_1, 102_2, 102_3, 102_4, and 102-5, the through holes of beam-limit aperture array 121 can be formed using a thin edge of an upside-down counterbore.

Aberration compensator array 123 is provided in four layers 123-1, 123-2, 123-3, and 123-4 with electrostatic shielding arrangement similar to FIG. 7. It is appreciated that the structure of aberration compensator array corresponds to the aberration compensator array of FIG. 5B. The structure of aberration compensator array 122 includes elements 123e that compensates aberrations of corresponding beamlets 102_1-102_5. Micro-compensator includes, for each beamlet, two elements 123e across multiple layers (e.g., for beamlet 102_5, the two elements 123e in layers 123-1 and 123-3). In each micro-compensator, one of element 123e can function as a micro-stigmator involving four or more segmented electrodes as shown in FIG. 3C, while the other element can function as a micro-lens involving the one or more annular electrode shown in FIG. 3B or FIG. 3C (when the same voltage is applied to all of the electrodes). Each of these micro-compensators can compensate aberrations of corresponding one of beamlets 102_1-102_5.

As shown above in FIG. 5B, sub-micro-compensators (elements) of two adjacent micro-compensators are not in the same layer. Moreover, in some embodiments, all elements in each layer may have the same function. For example, in layer 123-1, all elements 123e can function as a micro-lens. In other embodiments, the elements 123e in each layer can have different functionality. For example, in layer 123-1, the elements 123e corresponding to beamlets 102_4 and 102_5 can function as a micro-lens, while the element 123e corresponding to beamlet 102_1 can function as a micro-stigmator.

Image-forming element array 122 is provided in layer 122-1 and layer 122-2 with electrostatic shielding arrangement similar to FIG. 7. It is appreciated that the structure of image-forming element array corresponds to the image-forming element array of FIG. 5B. The structure of image-forming element array 122 includes elements 122e, which can function as micro-deflector involving two or more segmented electrodes as shown in FIG. 3C. Each of these micro-deflectors can deflect corresponding one of beamlets 102_1-102_5.

Figure 9A:
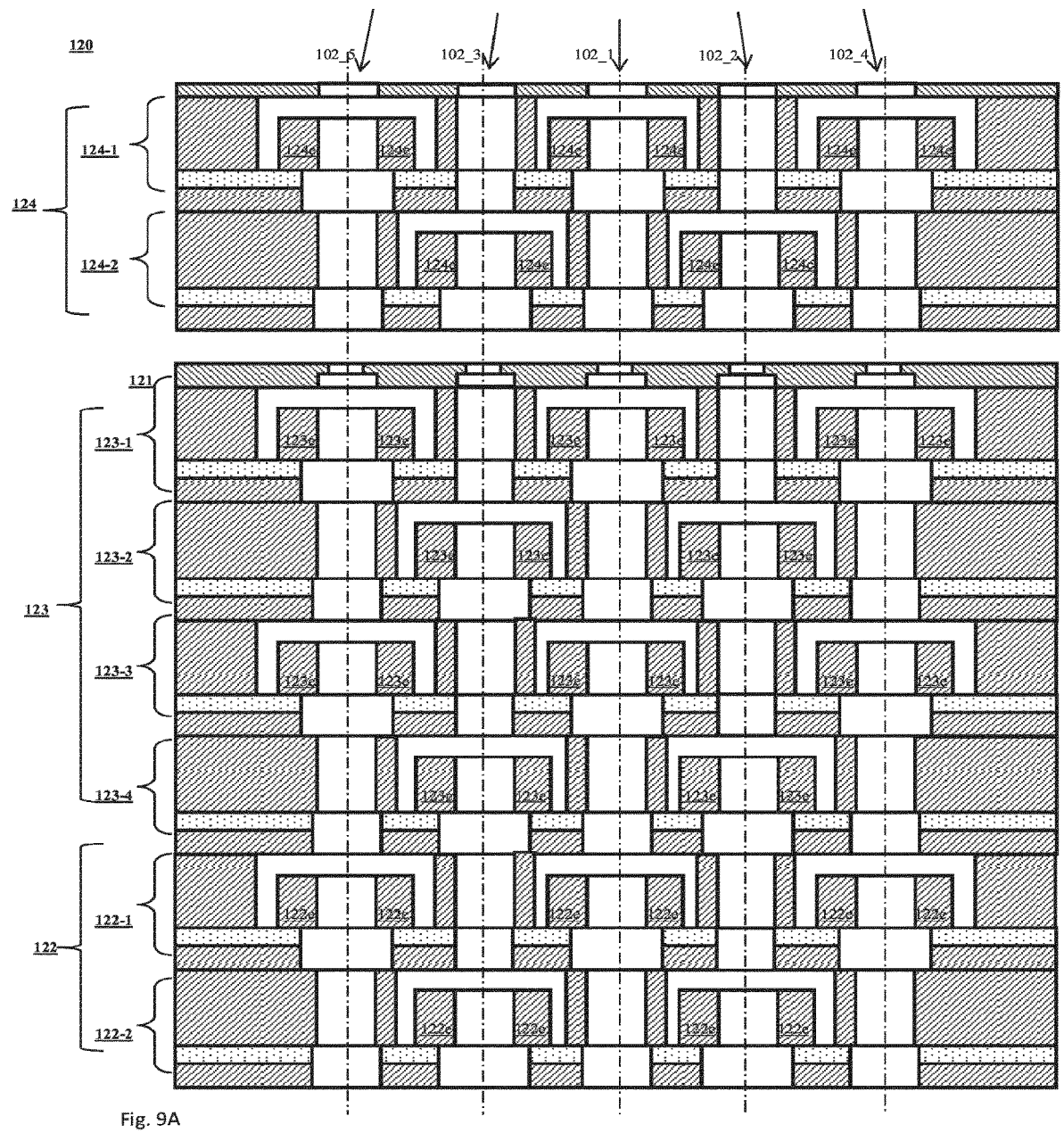
FIGS. 9A and 9B are schematic diagrams illustrating a configuration of a portion of an exemplary source conversion unit in a multi-beam inspection system with multiple pre-bending layers, multiple aberration-compensator layers and multiple image-forming layers, consistent with embodiments of the present disclosure.

FIG. 9A is a diagram illustrating an exemplary structure of a portion of an exemplary source conversion unit in a multi-beam inspection system, consistent with embodiments of the present disclosure. In particular, FIG. 9A shows a structure of a pre-bending element array 124 along with the array structure of FIG. 8C. Pre-bending element array 124 is similar to array structure 30 of FIG. 7. It is appreciated that the structure of source conversion unit in FIG. 9A corresponds to the source conversion unit of FIG. 6A.

Pre-bending element array 124 is provided in layer 124-1 and layer 124-2 with electrostatic shielding arrangement similar to FIG. 7. The structure of pre-bending element array 124 includes elements 124e, which can function as micro-deflector involving two or more segmented electrodes as shown in FIG. 3C. Each of these micro-deflectors can deflect corresponding one of beamlets 102_1-102_5. FIG. 9A shows a number of elements 124e across the layers 124-1 and 124-2. For example, layer 124-1 includes three elements 124e corresponding to the first, third, and fifth beamlet path holes associated with beamlets 102_1, 102_4, and 102_5, while layer 124-2 includes two elements 124e corresponding to the second and fourth beamlet path holes associated with beamlets 102_2 and 102_3.

Figure 9B:
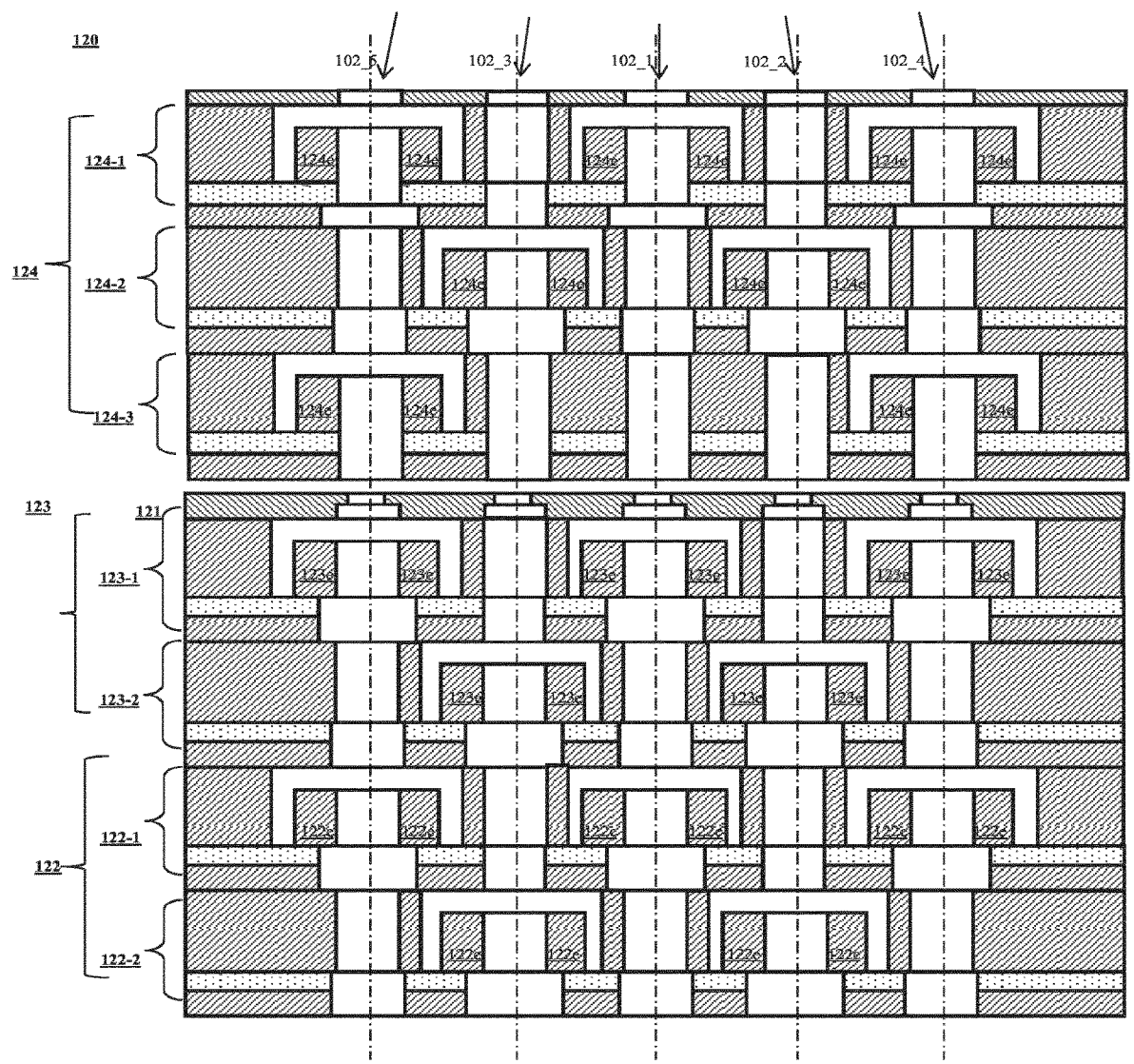

FIG. 9B is a diagram illustrating an exemplary structure of a portion of an exemplary source conversion unit in a multi-beam inspection system, consistent with embodiments of the present disclosure. In particular, FIG. 9B shows a structure of a pre-bending element array 124 along with the array structure of FIG. 8B. Pre-bending element array 124 is similar to array structure 30 of FIG. 7, except with more layers. It is appreciated that the structure of source conversion unit in FIG. 9B corresponds to the source conversion unit of FIG. 6C.

Pre-bending element array 124 is provided in three layers 124-1-124-3 with electrostatic shielding arrangement similar to FIG. 7. The structure of pre-bending element array 124 includes elements 124e, which can function as micro-deflectors involving two or more segmented electrodes as shown in FIG. 3C. Each of these micro-deflectors can deflect corresponding one of beamlets 102_1-102_5. FIG. 9B shows a number of elements 124e across the layers 124-1-124-3, with the outermost through holes (corresponding to beamlets 102_5 and 102_4) having elements 124e at both the first and third layers 124-1, 124-3.

The embodiments may further be described using the following clauses:

1. A source-conversion unit comprising:
    an image-forming element array having a plurality of image-forming elements configured to form a plurality of images of a charged-particle source by influencing a plurality of beamlets of a primary charged particle beam generated by the charged-particle source; and an aberration compensator array having a plurality of micro-compensators configured to compensate aberrations of the plurality of images, wherein each micro-compensator comprises a micro-lens element placed in one layer of a first set and a micro-stigmator element placed in another layer of the first set, wherein a layer of the first set includes at least one micro-lens element and at least one micro-stigmator element.

2. The source conversion unit of clause 1, wherein each micro-lens element functions as a micro-lens to compensate field curvature aberration and each micro-stigmator element functions as a micro-stigmator to compensate astigmatism aberration.

3. The source conversion unit of any one of clauses 1 and 2, further comprising a beamlet-limit aperture array having a plurality of beam-limit apertures.

4. The source conversion unit of clause 3, wherein each beam-limit aperture limits a size of one of the plurality of beamlets.

5. The source conversion unit of any one of clauses 1 through 4, further comprising a pre-bending element array having a plurality of pre-bending micro-deflectors.

6. The source conversion unit of clause 5, wherein each pre-bending micro-deflector bends one of the plurality of beamlets to enter the corresponding beam-limit aperture perpendicularly.

7. The source conversion unit of any one of clauses 5 and 6, wherein one or more pre-bending micro-deflectors comprise two or more sub-micro-deflectors placed in different layers of a second set to bend corresponding one beamlet in series.

8. The source conversion unit of any one of clauses 5 through 7, wherein each pre-bending micro-deflector of the plurality of pre-bending micro-deflectors is placed inside an electrically shielding cavity to be electrically shielded from other pre-bending micro-deflectors.

9. The source conversion unit of any one of clauses 1 through 8, wherein each image-forming element of the plurality of image-forming elements is placed inside an electrically shielding cavity to be electrically shielded from other image-forming elements.

10. The source conversion unit of any one of clauses 1 through 9, wherein each micro-compensator of the plurality of micro-compensators is placed inside one or more electrically shielding cavities to be electrically shielded from other micro-compensators.

11. The source conversion unit of any one of clauses 1 through 10, wherein each image-forming element comprises two or more image-forming sub-elements placed in different layers of a third set to influence corresponding one beamlet in series to form corresponding image.

12. A charged particle beam system comprising the source conversion unit of any one of clauses 1 through 11.

13. A source conversion unit comprising:

an image-forming element array having a plurality of image-forming elements placed in two or more layers of a first set, wherein the plurality of image-forming elements forms a plurality of images of a charged-particle source by influencing a plurality of beamlets of a primary charged particle beam generated by the charged-particle source.

14. The source conversion unit of clause 13, wherein each image-forming element comprises a micro-deflector to deflect one of the plurality of beamlets to form one of the plurality of images.

15. The source conversion unit of clause 13, wherein at least some of the image-forming elements comprises two micro-deflectors placed in two layers of the first set to deflect one of the plurality of beamlets in series to form one of the plurality of images.

16. The source conversion unit of clause 13, wherein one of the plurality of image-forming elements comprises one micro-deflector to deflect one of the plurality of beamlets to form one of the plurality of images, and another one of the plurality of image-forming elements comprises two micro-deflectors placed in two layers of the first set to deflect another one of the plurality of beamlets in series to form another one of the plurality of images.

17. The source conversion unit of any one of clauses 13 through 16, further comprising:

an aberration compensator array having a plurality of micro-compensators that are placed in two or more layers of a second set to compensate aberrations of the plurality of images.

18. The source conversion unit of clause 17, wherein:

each micro-compensator comprises a micro-lens element and a micro-stigmator element placed in different layers of the second set.

19. The source conversion unit of clause 18, wherein among the plurality of micro-compensators, one of micro-lens elements and one of micro-stigmator elements are placed in one layer of the second set.

20. The source conversion unit of any one of clauses 13 through 19, further comprising:

a beamlet-limit aperture array with a plurality of beam-limit apertures; and a pre-bending element array having a plurality of pre-bending micro-deflectors placed in two or more layers of a third set, wherein each beam-limit aperture limits a size of one of the plurality of beamlets, and each pre-bending micro-deflector bends one of the plurality of beamlets to enter the corresponding beam-limit aperture perpendicularly.

21. The source conversion unit of clause 20, wherein one or more pre-bending micro-deflector comprises two or more sub-micro-deflectors placed in different layers of the third set to bend corresponding one beamlet in series.

22. The source conversion unit of any one of clauses 20 and 21, wherein each pre-bending micro-deflector of the plurality of pre-bending micro-deflectors is placed inside an electrically shielding cavity to be electrically shielded from other pre-bending micro-deflectors.

23. The source conversion unit of any one of clauses 17 through 22, wherein each micro-compensator of the plurality of micro-compensators is placed inside one or more electrically shielding cavities to be electrically shielded from other micro-compensators.

24. The source conversion unit any one of clauses 13 through 22, wherein each image-forming element of the plurality of image-forming elements is placed inside an electrically shielding cavity to be electrically shielded from other image-forming elements.

25. A source conversion unit comprising:

an image-forming element array having a plurality of image-forming elements configured to form a plurality of images of a charged-particle source by influencing a plurality of beamlets of a primary charged particle beam generated by the charged-particle source;

a first electrically conductor element-covering plate with a plurality of first beam-path holes for the plurality of beamlets passing through;
a second electrically conductor element-covering plate with a plurality of second beam-path holes for the plurality of beamlets passing through;
a third electrically conductor element-covering plate with a plurality of third beam-path holes for the plurality of beamlets passing through;
a first electrically insulating lamination with a plurality of first beam-path orifices for the plurality of beamlets passing through;
a second electrically insulating lamination with a plurality of second beam-path orifices for the plurality of beamlets passing through;
a first electrically conductor element-holding plate with a plurality of first through holes; and
a second electrically conductor element-holding plate with a plurality of second through holes,
wherein the plurality of image-forming elements are alternately placed in corresponding first through holes and second through holes,
wherein the image-forming elements in the first through holes form a first image-forming layer, are electrically shielded by electrically shielding first cavities formed by the first and second electrically conductor element-covering plates and the first electrically conductor element-holding plate, and is isolated from walls of the electrically shielding first cavities by the first electrically insulating lamination,
wherein the image-forming elements in the second through hole form a second image-forming layer, are electrically shielded by electrically shielding second cavities formed by the second and third electrically conductor element-covering plates and the second electrically conductor element-holding plate, and is isolated from walls of the electrically shielding second cavities by the second electrically insulating lamination,
wherein each beamlet influenced by one image-formed element in the first image-forming layer passes through one corresponding second through hole, and each beamlet influenced by one image-formed element in the second image-forming layer passes through one corresponding first through hole.

26. A source conversion unit comprising:
a compensator array having a first layer of sub-micro-compensators that includes a micro-lens element and a micro-stigmator element.

27. A source conversion unit comprising:
an image-forming element array configured to receive a first beamlet via a first beam path and a second beamlet via a second beam path, wherein the image-forming element array comprises a first layer having a first image-forming element corresponding to the first beamlet and a second layer having a second image-forming element corresponding to the second beamlet.

28. A source conversion unit comprising:
an element array having first and second beam path holes through a first layer of the element array and a second layer of the element array,
wherein the first layer includes a first element configured to influence a first beamlet through the first beam path hole and the second layer includes a second element configured to influence a second beamlet through the second beam path hole,
wherein the first layer is separated from the second layer via an isolator, and
wherein the first layer includes an electrostatic shield between the first element and the second beam path hole and the second layer includes an electrostatic shield between the second element and the first beam path hole.

29. The source conversion unit of clause 13, wherein one or more of the image-forming elements comprises a compensator element.

30. The source conversion unit of clause 29, wherein the compensator element comprises any of a micro-lens or a stigmator.

31. The source conversion unit of clause 29, wherein one or more of the image forming elements comprises a compensator element that includes a micro-lens, wherein one or more of the image forming elements comprises a compensator that includes a stigmator that is a micro-stigmator, and wherein one or more of the image forming elements comprises a compensator that includes a micro-lens and a stigmator.

While the present invention has been described in connection with various embodiments, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The descriptions above are intended to be illustrative, not limiting. Thus, it will be apparent to one skilled in the art that modifications may be made as described without departing from the scope of the claims set out below.

What is claimed is:

1. A source-conversion unit comprising:
an image-forming element array having a plurality of image-forming elements configured to form a plurality of images of a charged-particle source by influencing a plurality of beamlets of a primary charged particle beam generated by the charged-particle source; and
an aberration compensator array having a plurality of micro-compensators configured to compensate aberrations of the plurality of images, wherein each micro-compensator comprises a micro-lens element placed in one layer of a first set of layers and a micro-stigmator element placed in another layer of the first set of layers,
wherein a layer of the first set of layers includes at least one micro-lens element and at least one micro-stigmator element.

2. The source conversion unit of claim 1, wherein each micro-lens element functions as a micro-lens to compensate field curvature aberration and each micro-stigmator element functions as a micro-stigmator to compensate astigmatism aberration.

3. The source conversion unit of claim 1, further comprising a beamlet-limit aperture array having a plurality of beam-limit apertures.

4. The source conversion unit of claim 3, wherein each beam-limit aperture limits a size of one of the plurality of beamlets.

5. The source conversion unit of claim 1, further comprising a pre-bending element array having a plurality of pre-bending micro-deflectors.

6. The source conversion unit of claim 5, wherein each pre-bending micro-deflector bends one of the plurality of beamlets to enter the corresponding beam-limit aperture perpendicularly.

7. The source conversion unit of claim 5, wherein one or more pre-bending micro-deflectors comprise two or more sub-micro-deflectors placed in different layers of a second set of layers to bend corresponding one beamlet in series.

8. The source conversion unit of claim 5, wherein each pre-bending micro-deflector of the plurality of pre-bending micro-deflectors is placed inside an electrically shielding cavity to be electrically shielded from other pre-bending micro-deflectors.

9. The source conversion unit of claim 1, wherein each image-forming element of the plurality of image-forming elements is placed inside an electrically shielding cavity to be electrically shielded from other image-forming elements.

10. The source conversion unit of claim 1, wherein each micro-compensator of the plurality of micro-compensators is placed inside one or more electrically shielding cavities to be electrically shielded from other micro-compensators.

11. The source conversion unit of claim 1, wherein each image-forming element comprises two or more image-forming sub-elements placed in different layers of a third set of layers to influence corresponding one beamlet in series to form corresponding image.

12. The source conversion unit of claim 1, wherein the plurality of image-forming elements comprises a first image-forming element and a second image-forming element that are adjacent to each other;
the first image-forming element and the second image-forming element are placed in different layers of the first set of layers;
the first image-forming element is an initial image-forming element of the image-forming element array in a path of a first beamlet of the plurality of beamlets; and
the second image forming element is an initial image-forming element in a path of a second beamlet of the plurality of beamlets.

13. The source conversion unit of claim 1, wherein
the micro-lens element comprises an annular electrode structure; and
the micro-stigmator element comprises a multi-pole electrode structure.

14. The source conversion unit of claim 13, wherein the multi-pole electrode structure comprises at least four electrostatic poles.

15. A source conversion unit comprising:
a compensator array having a first layer of sub-micro-compensators that includes a micro-lens element and a micro-stigmator element.

16. The source conversion unit of claim 15, wherein
the micro-lens element comprises an annular electrode structure; and
the micro-stigmator element comprises a multi-pole electrode structure.

17. The source conversion unit of claim 15, further comprising:
an image-forming element array having a plurality of image-forming elements configured to form a plurality of images of a charged-particle source by influencing a plurality of beamlets of a primary charged particle beam generated by the charged-particle source.

18. A source conversion unit comprising:
an image-forming element array configured to receive a first beamlet via a first beam path and a second beamlet via a second beam path, wherein the image-forming element array comprises a first layer having a first image-forming element corresponding to the first beamlet and a second layer having a second image-forming element corresponding to the second beamlet.

19. The source conversion unit of claim 18, wherein
the first image-forming element is an initial image-forming element in a path of the first beamlet; and
the second image forming element is an initial image-forming element in a path of a second beamlet.

20. The source conversion unit of claim 18, further comprising:
a compensator array having a third layer of sub-micro-compensators that includes a micro-lens element and a micro-stigmator element.

* * * * *